US012381193B2

(12) United States Patent
Gomes et al.

(10) Patent No.: US 12,381,193 B2
(45) Date of Patent: Aug. 5, 2025

(54) INTEGRATED CIRCUIT ASSEMBLIES

(71) Applicant: Intel Corporation, Santa Clara, CA (US)

(72) Inventors: Wilfred Gomes, Portland, OR (US); Abhishek A. Sharma, Hillsboro, OR (US); Van H. Le, Beaverton, OR (US); Doug B. Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 841 days.

(21) Appl. No.: 17/210,836

(22) Filed: Mar. 24, 2021

(65) Prior Publication Data

US 2022/0173090 A1 Jun. 2, 2022

Related U.S. Application Data

(60) Provisional application No. 63/119,928, filed on Dec. 1, 2020.

(51) Int. Cl.
 *H01L 25/18* (2023.01)
 *H01L 23/00* (2006.01)
 (Continued)

(52) U.S. Cl.
 CPC .............. *H01L 25/18* (2013.01); *H01L 23/12* (2013.01); *H01L 23/5286* (2013.01);
 (Continued)

(58) Field of Classification Search
 CPC ................... H01L 25/18; H01L 24/08; H01L 2224/08145; H01L 2225/06513;
 (Continued)

(56) References Cited

U.S. PATENT DOCUMENTS 8,841,777 B2  9/2014 Farooq et al.
9,640,509 B1  5/2017 Yang
 (Continued)

FOREIGN PATENT DOCUMENTS

JP  2007250618 A  9/2007
WO  2014051977 A1  4/2014

OTHER PUBLICATIONS

U.S. Appl. No. 17/114,537, filed Dec. 8, 2020, Hybrid Manufacturing For Integrated Circuit Devices and Assemblies.
 (Continued)

*Primary Examiner* — Thanh Y. Tran
(74) *Attorney, Agent, or Firm* — Akona IP PC

(57) ABSTRACT

Various aspects of the present disclosure set forth IC dies, microelectronic assemblies, as well as related devices and packages. One aspect relates to disaggregating 3D monolithic memory and compute functions to enable tight coupling for fast memory access at high bandwidth. Another aspect relates to microelectronic assemblies relate to nano-TSVs with 3D monolithic memory. Further aspects relate to die stitching and the use of glass carrier structures in microelectronic assemblies. Various aspects disclosed herein advantageously provide a robust set of implementations that may enable significant improvements in terms of optimizing performance of individual IC dies, microelectronic assemblies including one or more of such dies, and IC packages and devices including one or more of such microelectronic assemblies.

26 Claims, 19 Drawing Sheets

(51) Int. Cl.
*H01L 23/12* (2006.01)
*H01L 23/528* (2006.01)
*H01L 23/538* (2006.01)
*H01L 25/065* (2023.01)

(52) U.S. Cl.
CPC ...... *H01L 23/5384* (2013.01); *H01L 23/5385* (2013.01); *H01L 23/5386* (2013.01); *H01L 24/08* (2013.01); *H01L 25/0652* (2013.01); *H01L 2224/08145* (2013.01); *H01L 2225/06513* (2013.01); *H01L 2225/06541* (2013.01); *H01L 2225/06582* (2013.01); *H01L 2225/06589* (2013.01); *H01L 2924/1431* (2013.01); *H01L 2924/1436* (2013.01); *H01L 2924/1437* (2013.01)

(58) Field of Classification Search
CPC . H01L 2225/06541; H01L 2225/06589; H01L 2924/1431; H01L 2924/1436; H01L 25/0655; H01L 25/072
See application file for complete search history.

(56) References Cited

U.S. PATENT DOCUMENTS

| | | |
|---|---|---|
| 10,224,318 B2 | 3/2019 | Kurita et al. |
| 11,044,812 B2 | 6/2021 | Voraberger |
| 11,239,208 B2 | 2/2022 | Chuang et al. |
| 11,737,288 B2 | 8/2023 | Ho et al. |
| 11,749,729 B2 | 9/2023 | Chen |
| 2004/0000722 A1 | 1/2004 | Powers |
| 2006/0012966 A1 | 1/2006 | Chakravorty |
| 2010/0059898 A1 | 3/2010 | Keeth et al. |
| 2011/0073998 A1 | 3/2011 | Lin |
| 2012/0193697 A1 | 8/2012 | Takemura |
| 2012/0248621 A1 | 10/2012 | Sadaka |
| 2013/0140680 A1 | 6/2013 | Harada et al. |
| 2014/0239458 A1 | 8/2014 | Farooq et al. |
| 2015/0021771 A1 | 1/2015 | Lin |
| 2015/0162185 A1 | 6/2015 | Pore |
| 2015/0228551 A1 | 8/2015 | Oi et al. |
| 2016/0240503 A1 | 8/2016 | Shu et al. |
| 2016/0318757 A1 | 11/2016 | Chou et al. |
| 2016/0343762 A1 | 11/2016 | Kagawa et al. |
| 2017/0025381 A1 | 1/2017 | Tsai et al. |
| 2017/0110494 A1 | 4/2017 | Tsai et al. |
| 2017/0200700 A1 | 7/2017 | Das et al. |
| 2018/0068980 A1* | 3/2018 | Clegg .................... H01L 24/17 |
| 2018/0181524 A1* | 6/2018 | Schulz .................. G06F 13/385 |
| 2018/0277517 A1 | 9/2018 | Kim et al. |
| 2018/0366456 A1 | 12/2018 | Jeong et al. |
| 2019/0058109 A1 | 2/2019 | Chen et al. |
| 2019/0157227 A1 | 5/2019 | Fillion et al. |
| 2019/0221557 A1 | 7/2019 | Kim et al. |
| 2019/0371891 A1 | 12/2019 | Goktepeli et al. |
| 2020/0013673 A1 | 1/2020 | Zierath et al. |
| 2020/0075497 A1 | 3/2020 | Dabral et al. |
| 2020/0090990 A1 | 3/2020 | Fan et al. |
| 2020/0098719 A1 | 3/2020 | Park et al. |
| 2020/0105719 A1 | 4/2020 | Li et al. |
| 2020/0135617 A1 | 4/2020 | Shen et al. |
| 2020/0135683 A1 | 4/2020 | Kim et al. |
| 2020/0135719 A1 | 4/2020 | Brewer |
| 2020/0144242 A1 | 5/2020 | Park |
| 2020/0203329 A1 | 6/2020 | Kanamori et al. |
| 2020/0211970 A1 | 7/2020 | Gomes et al. |
| 2020/0286842 A1* | 9/2020 | Sanuki .................... H01L 24/09 |
| 2020/0303301 A1 | 9/2020 | Chen et al. |
| 2020/0303343 A1 | 9/2020 | Manipatruni et al. |
| 2020/0303361 A1 | 9/2020 | Shih |
| 2020/0312817 A1 | 10/2020 | Wu et al. |
| 2020/0365514 A1 | 11/2020 | Yang et al. |
| 2020/0381512 A1 | 12/2020 | Kao et al. |
| 2020/0411428 A1 | 12/2020 | Lilak et al. |
| 2021/0020596 A1 | 1/2021 | Yi et al. |
| 2021/0057309 A1 | 2/2021 | Hu et al. |
| 2021/0366855 A1 | 11/2021 | Okina |
| 2021/0375790 A1 | 12/2021 | Oda et al. |
| 2021/0407565 A1* | 12/2021 | Contreras ............ G11C 7/1048 |
| 2022/0139771 A1 | 5/2022 | Chang |
| 2022/0181285 A1 | 6/2022 | Hong et al. |
| 2022/0285240 A1 | 9/2022 | Huang et al. |
| 2022/0293513 A1 | 9/2022 | Li et al. |
| 2022/0415841 A1 | 12/2022 | Sharma et al. |

OTHER PUBLICATIONS

U.S. Appl. No. 17/114,700, filed Dec. 8, 2020, Hybrid Manufacturing For Integrated Circuit Devices and Assemblies.

Tallis, Billy, "Micron 3D NAND Status Update," AnandTech, retrieved from the internet on Jun. 10, 2019, https://www.anandtech.com/show/10028/micron-3d-nand-status-update, 6 pages.

International Search Report and Written Opinion in International Patent Application No. PCT/US2021/051882 dated Jan. 11, 2022, 9 pages.

International Search Report and Written Opinion in International Patent Application No. PCT/US2021/051887 dated Jan. 10, 2022, 10 pages.

Barroso, Luiz A., "Impact of Chip-Level Integration on Performance of OLTP Workloads," Sixth International Symposium on High-Performance Computer Architecture (HPCA), Jan. 2000, 12 pages.

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 12, 2020 (pp. 6-6); 4 pages.

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

* cited by examiner

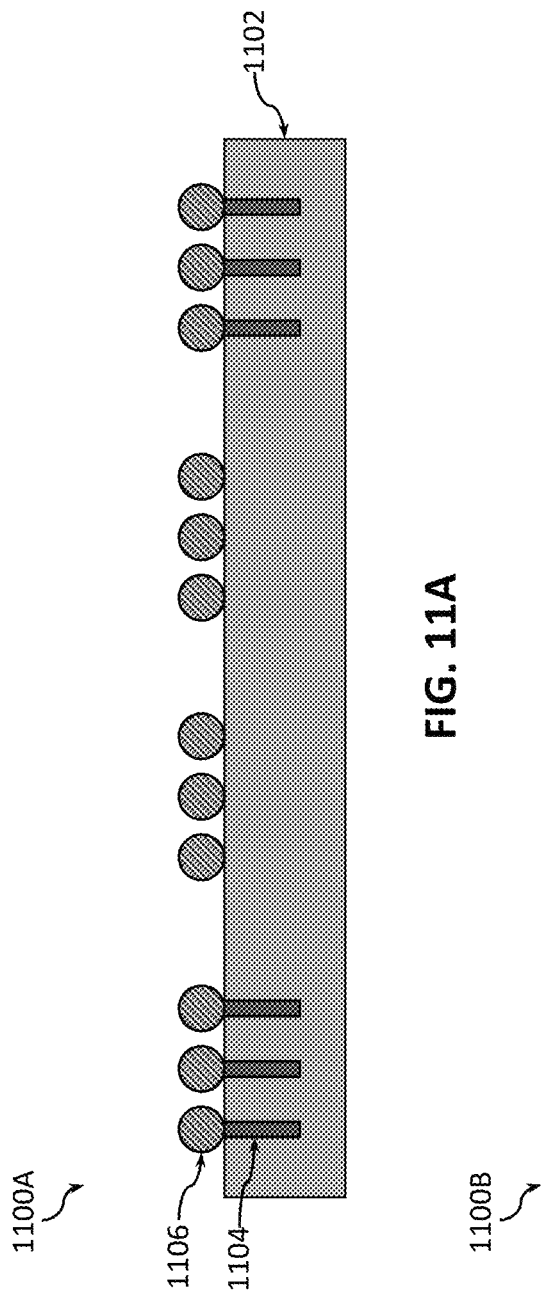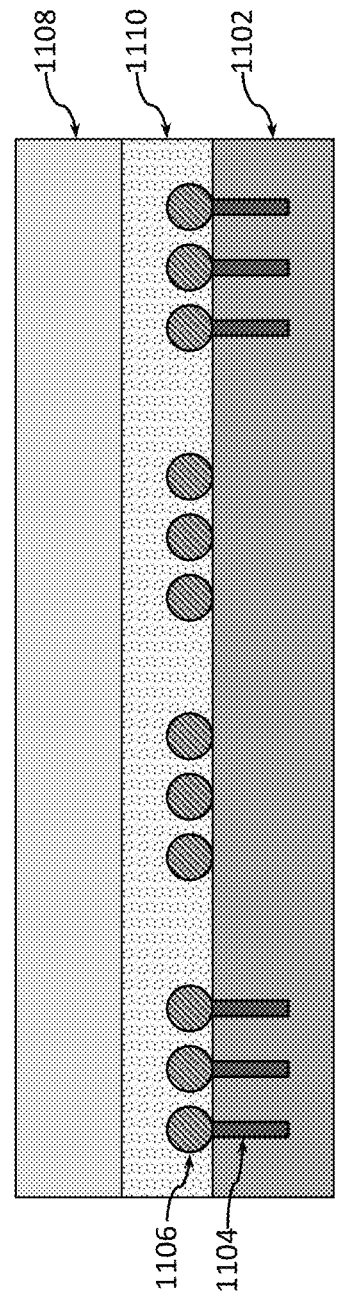

INTEGRATED CIRCUIT ASSEMBLIES

RELATED APPLICATIONS

This application claims the benefit of and priority from U.S. Provisional Patent Application Ser. No. 63/119,928, titled "INTEGRATED CIRCUIT ASSEMBLIES," filed on Dec. 1, 2020, hereby incorporated by reference in its entirety.

TECHNICAL FIELD

This disclosure relates generally to the field of semiconductor devices, and more specifically, to integrated circuit (IC) assemblies that include microelectronic assemblies of IC structures with memory and compute logic, as well as related devices, packages, and methods.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 11A-11F provide schematic illustrations of cross-sectional side view of a microelectronic assembly with a glass carrier at different instances of a fabrication process, in accordance with some embodiments.

DETAILED DESCRIPTION

Overview

Figure 1:
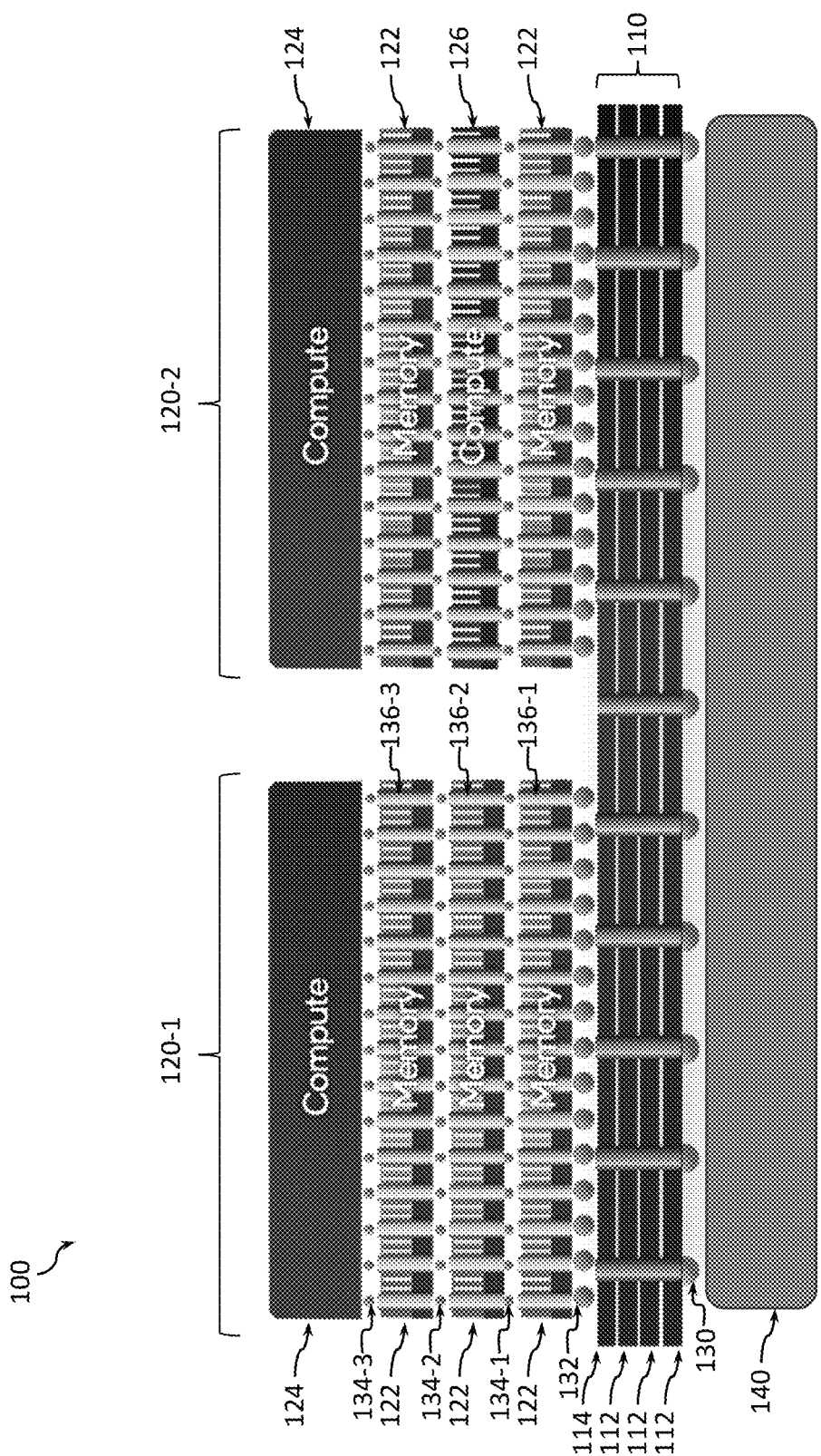
FIG. 1 provides a schematic illustration of a cross-sectional side view of a microelectronic assembly with a base structure and one or more stacks of one or more of memory and/or compute dies that may be stacked over the base structure, in accordance with some embodiments.

The systems, methods, and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating IC assemblies presented herein, described with reference to various microelectronic assemblies and related methods, devices, and packages (e.g., IC packages), it might be useful to first understand phenomena that may come into play during IC manufacturing. The following foundational information may be viewed as a basis from which the present disclosure may be properly explained. Such information is offered for purposes of explanation only and, accordingly, should not be construed in any way to limit the broad scope of the present disclosure and its potential applications.

IC dies are conventionally coupled to a package substrate for mechanical stability and to facilitate connection to other components, such as circuit boards. The performance that can be realized by such conventional IC packages is constrained by the performance of the die, manufacturing, materials, and thermal consideration, among others. Furthermore, communicating large numbers of signals between multiple dies in a multi-die IC package is challenging due to the increasingly small size of such dies, thermal constraints, and power delivery constraints, among others. Including a combination of memory and compute dies in a multi-die IC package further exacerbates the challenges.

Various aspects of the present disclosure set forth IC dies, microelectronic assemblies, as well as related devices and packages. One aspect relates to disaggregating three-dimensional (3D) monolithic memory, e.g., dynamic random-access memory (DRAM), and compute functions to enable tight coupling for fast memory access at high bandwidth. Another aspect relates to microelectronic assemblies relate to nano-TSVs with 3D monolithic memory. Further aspects relate to die stitching and the use of glass carrier structures in microelectronic assemblies. Various aspects disclosed herein advantageously provide a robust set of implementations that may enable significant improvements in terms of optimizing performance of individual IC dies, microelectronic assemblies including one or more of such dies, and IC packages and devices including one or more of such microelectronic assemblies.

Some aspects of the present disclosure may relate to die-level memory integration, e.g., aspects related to disaggregating 3D monolithic memory and compute functions, or aspects related to nano-TSVs with 3D monolithic memory. Other aspects of the present disclosure relate to microelectronic assemblies with features that may, but do not have to, be used as a part of die-level memory integration, e.g., aspects related to die stitching or to the use of glass carrier structures in microelectronic assemblies. In various embodiments of the present disclosure, any of the embodiments of one aspect disclosed herein may, but do not have to, be combined with embodiments of any other aspects. For example, a microelectronic assembly implementing disaggregation of 3D monolithic memory and compute functions as described herein may also use one or more glass carrier structures and/or die stitching as described herein. In another example, a microelectronic assembly implementing disaggregation of 3D monolithic memory and compute functions as described herein may also implement nano-TSVs with 3D monolithic memory, as well as use one or more glass carrier structures, and include die stitching as described herein.

An example microelectronic assembly related to disaggregating 3D monolithic memory and compute functions to enable tight coupling for fast memory access at high bandwidth may include a base memory structure (e.g., a base structure 110, described herein) and a die stack (e.g., a stack 120, described herein), coupled to the base memory structure. The base memory structure may include a base memory die (e.g., a memory die 112, described herein), a base compute die (e.g., a compute die 114, described herein), and a bonding interface between the base memory die and the base compute die. The die stack may be coupled to the base memory structure by having the stack memory die being coupled to the base compute die. The die stack may include a stack memory die (e.g., a stack memory die 122, described herein) and a stack compute die (e.g., a stack compute die 124, described herein). The base memory die may include a plurality of memory cells that include backend transistors and may further include a base memory die control logic that includes frontend transistors. The base compute die may include a plurality of transistors (e.g., frontend transistors) configured to control operation of the base memory die. Furthermore, such a microelectronic assembly may further include signal vias and power vias extending through the bonding interface between the base memory die and the base compute die, where cross-sectional dimensions (e.g., diameters) and pitches of the power vias are larger than cross-sectional dimensions and pitches of the signal vias. Various portions of such a microelectronic assembly (e.g., a base memory structure and/or a die stack) may be fabricated using hybrid manufacturing. As used herein, "hybrid manufacturing" refers to fabricating a microelectronic assembly by bonding together at least two IC dies fabricated by different manufacturers, using different materials, or different manufacturing techniques.

An example microelectronic assembly related to nano-TSVs with 3D monolithic memory may include a circuit board or a package substrate (e.g., a package substrate 1202, described herein), and a memory die (e.g., a base memory die 112 or 412, described herein), coupled to the circuit board or the package substrate. The memory die may include a data block (e.g., a data block 810, described herein) that includes a memory array circuit (e.g., a memory array circuit 820, described herein), where the memory array circuit includes a memory array (e.g., a memory array 822, described herein) and a plurality of signal vias (e.g., signal vias 824, described herein) associated with the memory array by being configured to communicate signals to/from the memory array. The memory die may further include a plurality of power vias (e.g., power vias 830, described herein) associated with the data block by being configured to provide power to IC components of the data block. The plurality of power vias and the plurality of signal vias may extend between opposing faces of the memory die (e.g., the power and signal vias may be TSVs). The plurality of signal vias may be arranged in a first line (e.g., a line associated with one of the groups 826, described herein), the plurality of signal vias may be arranged in a second line (e.g., a line associated with one of the groups 836, described herein), and, in a plane of the memory die, the second line may be substantially perpendicular to the first line.

An example microelectronic assembly related to die stitching may include a stitched memory die (e.g., a base memory die 112 or 412, described herein) that includes a first memory die (e.g., a memory die 910-1, described herein), a second memory die (e.g., a memory die 910-2, described herein), and a stitch conductive line (e.g., a stitch metal line 940, described herein). The first memory die may include first components (e.g., a plurality of first memory cells, e.g., such as the memory cells 600) and first conductive lines (e.g., die metal lines 920 of the memory die 910-1, described herein), the first conductive lines configured to provide electrical connectivity between various two or more of the first components. The second memory die may include second components (e.g., a plurality of second memory cells, e.g., such as the memory cells 600) and second conductive lines (e.g., die metal lines 920 of the memory die 910-2, described herein), the second conductive lines configured to provide electrical connectivity between various two or more of the second components, the second memory die being coplanar with the first memory die. The stitch conductive line may be provided in a plane of or parallel to a plane of the first memory die (or a plane of the second memory die, since these two dies are coplanar), and may have a first end electrically coupled to at least one of the first conductive lines and have a second end electrically coupled to at least one of the second conductive lines.

An example microelectronic assembly related to the use of glass carrier structures may include a glass carrier structure (e.g., a glass carrier 1108, described herein) and a die (e.g., a die 1102, described herein) that includes one or more memory devices and, optionally, one or more logic circuits. Each of the glass carrier structure and the die has a frontside and a backside, the backside being a face that is opposite the frontside. The microelectronic assembly may further include a bonding material between the frontside of the die and the frontside of the glass carrier to secure (attach) the frontside of the die to the frontside of the glass carrier.

In the following detailed description, various aspects of the illustrative implementations will be described using terms commonly employed by those skilled in the art to convey the substance of their work to others skilled in the art.

For example, unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.). The term "circuit" may be used to describe one or more passive and/or active components that are arranged to cooperate with one another to provide a desired function.

In other example, the term "interconnect" may be used to describe any element formed of an electrically conductive material for providing electrical connectivity to one or more components associated with an IC or/and between various such components. In context of an IC die/chip, the term "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of the IC die/chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in not adjacent levels. A term "metallization stack" may be used to refer to a stack of one or more interconnects for providing connectivity to different circuit components of an IC die/chip. Sometimes, metal lines and vias may be referred to as "conductive lines/traces" and "conductive vias", respectively, to highlight the fact that these elements include electrically conductive materials such as, but not limited to, metals. On the other hand, in context of a stack of dies coupled to one another or in context of a die coupled to a package substrate, the term "interconnect" may refer to, respectively, to die-to-die (DTD) interconnects and die-to-package substrate (DTPS) interconnects.

In various embodiments, components associated with an IC (i.e., IC components) may include, for example, transistors, diodes, power sources, resistors, capacitors, inductors, sensors, transceivers, receivers, antennas, etc. In various embodiments, components associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed as part of a chipset for executing one or more related functions in a computer.

As used herein, the terms "die" and "IC die" are synonymous, as are the terms "component" and "IC component," the terms "circuit" and "IC circuit," or the terms "package" and "IC package." The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). The terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. Although certain elements may be referred to in the singular herein, such elements may include multiple sub-elements. For example, "an electrically conductive material" may include one or more electrically conductive materials. In another example, a "dielectric material" may include one or more dielectric materials.

The description uses phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For purposes of explanation, specific numbers, materials and configurations are set forth in order to provide a thorough understanding of the illustrative implementations.

However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 10A-10B, such a collection may be referred to herein without the letters, e.g., as "FIG. 10."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory dies and/or compute dies of microelectronic assemblies illustrated in some drawings, or a certain number of power vias, signal vias, DTD interconnects, and DTPS interconnects illustrated in other drawings, etc.), this is simply for ease of illustration, and more, or less, than that number may be included in microelectronic assemblies and related devices/packages according to various embodiments of the present disclosure. Still further, various views shown in some of the drawings are intended to show relative arrangements of various elements therein. In other embodiments, various microelectronic assemblies and related devices/packages, or portions thereof, may include other elements or components that are not illustrated (e.g., transistor portions, various components that may be in electrical contact with any of the illustrated components of the microelectronic assemblies and related devices/packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more microelectronic assemblies and related devices/packages as described herein.

Disaggregating 3D Monolithic Memory and Compute Functions

FIG. 1 provides a schematic illustration of a cross-sectional side view of a microelectronic assembly 100 with a base structure 110 and one or more stacks 120 of one or more of memory and/or compute dies that may be stacked over the base structure 110, in accordance with some embodiments.

FIG. 1 illustrates two stacks 120, labeled as stacks 120-1 and 120-2, but in other embodiments, more or less stacks 120 may be implemented in the microelectronic assembly 100. In some embodiments, the microelectronic assembly 100 may only include the base structure 110 and none of the stacks 120. When included in the microelectronic assembly 100, the stack 120 may include one or more of stack memory dies 122 and stack compute dies 124. FIG. 1 illustrates the stack 120-1 as having three stack memory dies 122 and one stack compute die 124 and illustrates the stack 120-2 as having two stack memory dies 122, one stack compute die 124, and one additional stack compute die 126, however, in other embodiments, the number, the order, and the nature of the dies included in the stack 120 may be different. The microelectronic assembly 100 may be seen as an example of disaggregating a 3D monolithic memory (e.g., a 3D monolithic DRAM) and compute functions to enable tight coupling for fast memory access at high bandwidth. The disaggregation is represented in the illustration of FIG. 1 by having a plurality (e.g., two) of stacks 120 as described herein, as opposed to only having one. Furthermore, instead of including both memory and compute functions in a single die, the microelectronic assembly 100 may separate some of these functions to individual, designated dies, which is another feature of disaggregation. For example, instead of including the stack memory dies 122 in the stack compute dies 124, the stack memory dies 122 may be separate from the stack compute die(s) 124, as shown in FIG. 1. In another example, instead of including the stack memory dies 122 and the base memory dies 112 in a single die, these dies may be separated as shown in FIG. 1. Similarly, instead of including the compute dies 124, 126, and 114, these dies may be separated as shown in FIG. 1. Some illustrative, example differences between the functions performed by the individual memory and compute dies shown in FIG. 1 are described in greater detail below.

FIG. 1 illustrates that, in some embodiments, the base structure 110 may be coupled to a further IC component 140 by interconnects 130. In some embodiments, the further IC component 140 may be a package substrate (e.g., a package substrate 1202, described herein), in which case the interconnects 130 may be DTPS interconnects and the microelectronic assembly 100 is an IC package. In other embodiments, the further IC component 140 may be an interposer or another memory or compute die, in which case the interconnects 130 may be DTD interconnects. In some embodiments, the interconnects 130 may include bumps, e.g., solder bumps, and may have a pitch between about 80 and 200 micrometers (micron), including all values and ranges therein, e.g., between about 90 and 150 micron, or between about 100 and 120 micron.

In other embodiments, the further IC component 140 and the interconnects 130 may be excluded from the microelectronic assembly 100. In some such embodiments, the base structure 110 may be a package substrate (e.g., a package substrate 1202, described herein), in which case interconnects 132 may be DTPS interconnects. In such embodiments, the base structure 110 may include one or more of a ceramic material and an organic material, and/or the base structure 110 may be a printed circuit board (PCB).

In some embodiments, the base structure 110 may be a base memory structure that may include one or more base memory dies 112 and one or more base compute dies 114, as shown in FIG. 1. In some embodiments, the base memory dies 112 and the base compute dies 114 may be coupled to one another using hybrid bonding, described in greater detail below. The base compute die 114 may be coupled to the bottom one of the memory dies 122 of the stack 120 by interconnects 132. In other words, in some embodiments, the stack 120 may be a microelectronic assembly that includes at least two stack memory dies 122 and at least one stack compute die 124, and that is coupled to the base structure 110 by the interconnects 132. In some embodiments, the interconnects 132 may have a pitch between about 15 and 40 micron, including all values and ranges therein, e.g., between about 18 and 36 micron, or between about 20 and 30 micron. In various embodiments, the interconnects 132 may be hybrid bonding interconnects, die-to-base interconnects, may include solder, and/or may include an anisotropic conductive material.

Various dies of the microelectronic assembly of the stack 120 may be coupled to one another by interconnects 134, labeled for the stack 120-1 of FIG. 1 as interconnects 134-1 through 134-3. In some embodiments, the interconnects 134 may be hybrid bonding interconnects, D2D interconnects, may include solder and/or may include an anisotropic conductive material. In some embodiments, through-silicon vias (TSVs) 136 may extend through one or more of the stack memory dies 122 and stack compute dies 124 to couple power and signals between these dies. The cross-sectional dimensions (e.g., diameters) of the TSVs 136 in different dies of the stack 120 may be different. For example, the cross-sectional dimensions (e.g., diameters) of the TSVs 136-1 (i.e., the TSVs in the die of the stack 120 that is closest to the base structure 110) may be between about 15 and 25 micron, e.g., about 20 micron. On the other hand, the cross-sectional dimensions (e.g., diameters) of the TSVs 136-2 (i.e., the TSVs in the die of the stack 120 that is closest to the die of the stack 120 that is closest to the base structure 110) may be between about 0.8 and 1.5 micron, e.g., about 1 micron. In another example, the cross-sectional dimensions (e.g., diameters) of the TSVs 136-3 (i.e., the TSVs in the die of the stack 120 that is closer to the stack compute die 124 than to the base structure 110) may be between about 2 and 10 micron, e.g., between about 3 and 9 micron.

Although not specifically shown in all of the present illustrations in order to not clutter the drawings, when DTD or DTPS interconnects are described (e.g., when the interconnects 130 are DTPS interconnects and/or when the interconnects 132 or 134 are DTD interconnects), a surface of a first die may include a first set of conductive contacts, and a surface of a second die or a package substrate (e.g., a package substrate 1202, described herein) may include a second set of conductive contacts. One or more conductive contacts of the first set may then be electrically and mechanically coupled to some of the conductive contacts of the second set by the DTD or DTPS interconnects. In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies, and/or the DTD interconnects may include small conductive bumps or pillars (e.g., copper bumps or pillars) attached to the respective conductive contacts by solder. In some embodiments, some or all of the DTD interconnects in a microelectronic assembly or an IC package as described herein may be solder interconnects that include a solder with a higher melting point than a solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In some embodiments, a set of DTD interconnects may include solder. DTD interconnects that include solder may include any appropriate solder material, such as any of the materials discussed above for the DTPS interconnects. In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects. In some embodiments, the DTPS interconnects disclosed herein may have a pitch between about 80 microns and 300 microns, while the DTD interconnects disclosed herein may have a pitch between about 7 microns and 100 microns.

Continuing with the description of FIG. 1, in particular, turning to memory circuits implemented in the microelectronic assembly 100, some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. Various embodiments of the present disclosure relate to embedded memory arrays, as well as corresponding methods and devices. In particular, in some embodiments, the base structure 110 may be a relatively large memory, coupled to one or more stack memory dies 122, the stack compute dies 124, and one or more additional stack compute dies 126 of the one or more stacks 120. Stacking various layers in this manner advantageously allows scaling by adding more layers of memory and compute dies, as needed.

Embedded memory is important to the performance of modern system-on-a-chip (SoC) technology. Static random-access memory (SRAM) is one example of embedded memory, particularly suitable for modern SoC due to its compatibility with fabrication processes used to manufacture computing logic, e.g., frontend of line (FEOL) processes. However, for some applications demanding large on-die cache, such as tens of megabytes (MBs) for handling memory bandwidth, the area and standby power of a SRAM-based cache may pose significant challenges to SoC design. Alternative higher density embedded memory technology, such as DRAM and in particular, embedded DRAM (eDRAM), has been introduced to address the limitation in density and standby power of a large SRAM-based cache.

The memory implemented in the base structure 110 (e.g., implemented in the base memory dies 112) may be a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the base structure 110 may be a memory that is not divided into hierarchical layer or levels in terms of access of its data. In some embodiments, at least portions of memory arrays of the memory dies 112 may be formed of backend transistors (i.e., transistors formed by back end of line (BEOL) processes), e.g., implemented as an eDRAM. On the other hand, the memory implemented in the stack(s) 120 (e.g., implemented in the memory dies 122) may be a hierarchical memory and may include different types of memory than the base structure 110. For example, in some embodiments, the memory implemented in the stack memory dies 122 may be formed of frontend transistors (i.e., transistors formed by FEOL processes), e.g., implemented as an embedded SRAM. In some embodiments, some of the stack memory dies 122 may also include eDRAM. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1, m_2, \ldots, m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory dies 122 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory dies 122 may be arranged.

Just as distinctions may be made between the stack memory dies 122 and the base memory dies 112 for some embodiments of the microelectronic assembly 100, distinctions may also be made between the base compute dies 114, the stack compute dies 124, and the additional stack compute dies 126. For example, in some embodiments, the base compute die 114 may be responsible for read/write operations with respect to the data stored in the base memory dies 112. To that end, the base compute die 114 may include one or more I/O ICs configured to control access to data stored in the base memory dies 112. On the other hand, the stack compute dies 124 may be high-performance compute dies, configured to perform various operations with respect to data stored in the base memory dies 112 and the stack memory dies 122 (e.g., arithmetic and logic operations, pipelining of data from one or more of the base memory dies 112, the stack memory dies 122, and possibly also data from external devices/chips). For example, in contrast to the stack compute dies 124, the base compute die 114 may be configured to only control I/O access to data but not perform any operations on the data. In some embodiments, one or more additional stack compute dies 126 may be included in any of the stacks 120, where the additional stack compute dies 126 may implement ICs configured to implement I/O control of data stored in the stack memory dies 122, assemble data from the stack memory dies 122 and/or base memory dies 112 for transport (e.g., transport over a central bus) to the stack compute die 124, etc. In some embodiments, the additional stack compute dies 126 may not be configured to perform any operations on the data besides I/O and assembling for transport to the stack compute die 124.

In various embodiments of the present disclosure, transistors described herein may be field-effect transistors (FETs), e.g., metal oxide semiconductor (MOS) FETs (MOSFETs). In general, a FET is a three-terminal device that includes source, drain, and gate terminals and uses electric field to control current flowing through the device (e.g., through a channel portion of the transistor). A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

Figure 2:
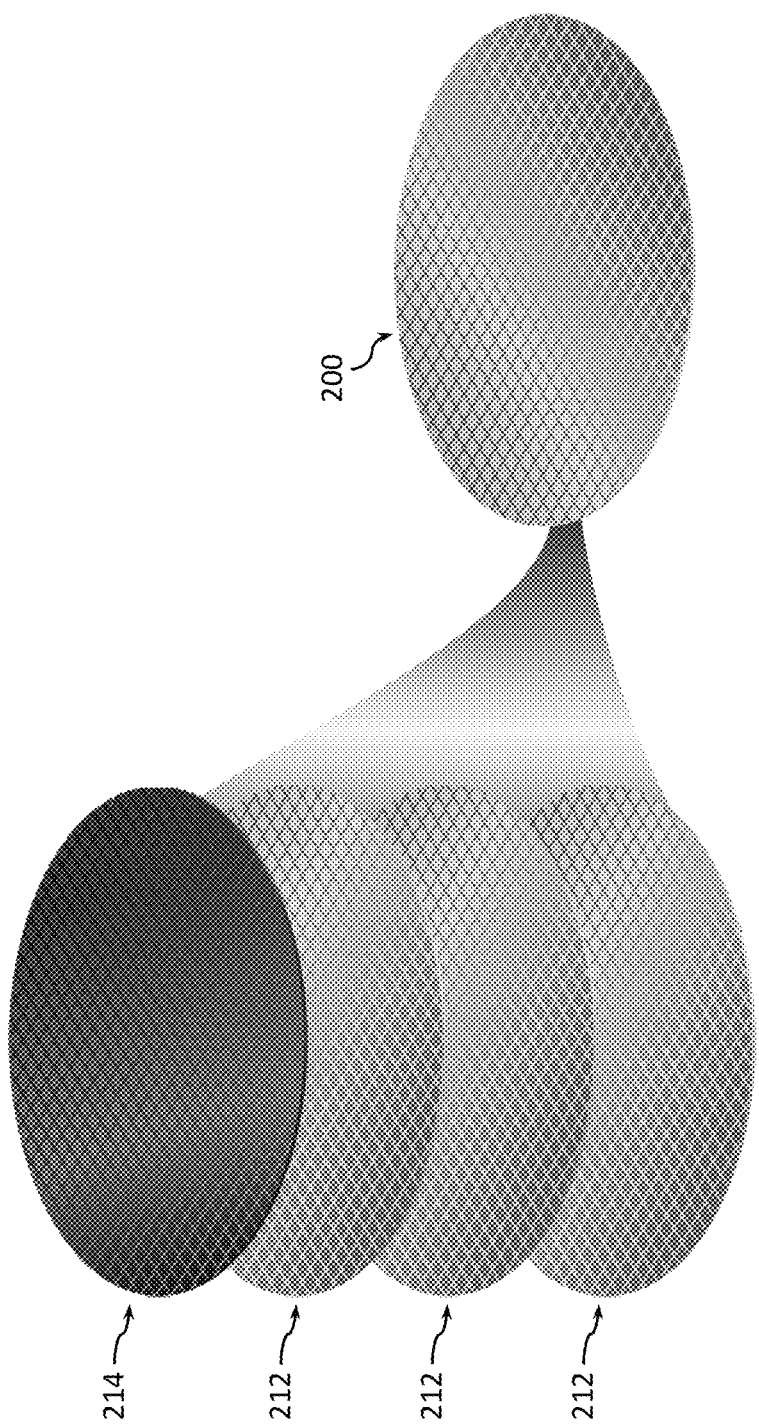
FIG. 2 illustrates wafer-to-wafer stacking of a base memory wafer stack that may be used to implement a base memory structure of a microelectronic assembly, in accordance with some embodiments.

FIG. 2 illustrates wafer-to-wafer stacking of a base memory wafer stack 200 that may be used to implement a base memory structure of a microelectronic assembly, in accordance with some embodiments. The base memory wafer stack 200 may provide a basis for forming the base structure 110 of FIG. 1, e.g., in the embodiments of the microelectronic assembly 100 where the base structure 110 implements basin memory. To that end, FIG. 2 illustrates that the base memory wafer stack 200 may be implemented by stacking a plurality of wafers, e.g., wafers 212 and 214 as shown in FIG. 2, bonded to one another by hybrid bonding. The wafers 212 may include transistors (e.g., backend transistors) forming memory cells to implement memory arrays of the base memory wafer stack 200, while the wafer 214 may include transistors (e.g., frontend transistors) forming control logic configured to control operation of (e.g., to control input/output or read/write to) the memory arrays of the memory cells of the wafers 212. Thus, the wafers 212 may be referred to as "memory wafers," while the wafer 214 may be referred to as a "compute wafer."

Figure 3:
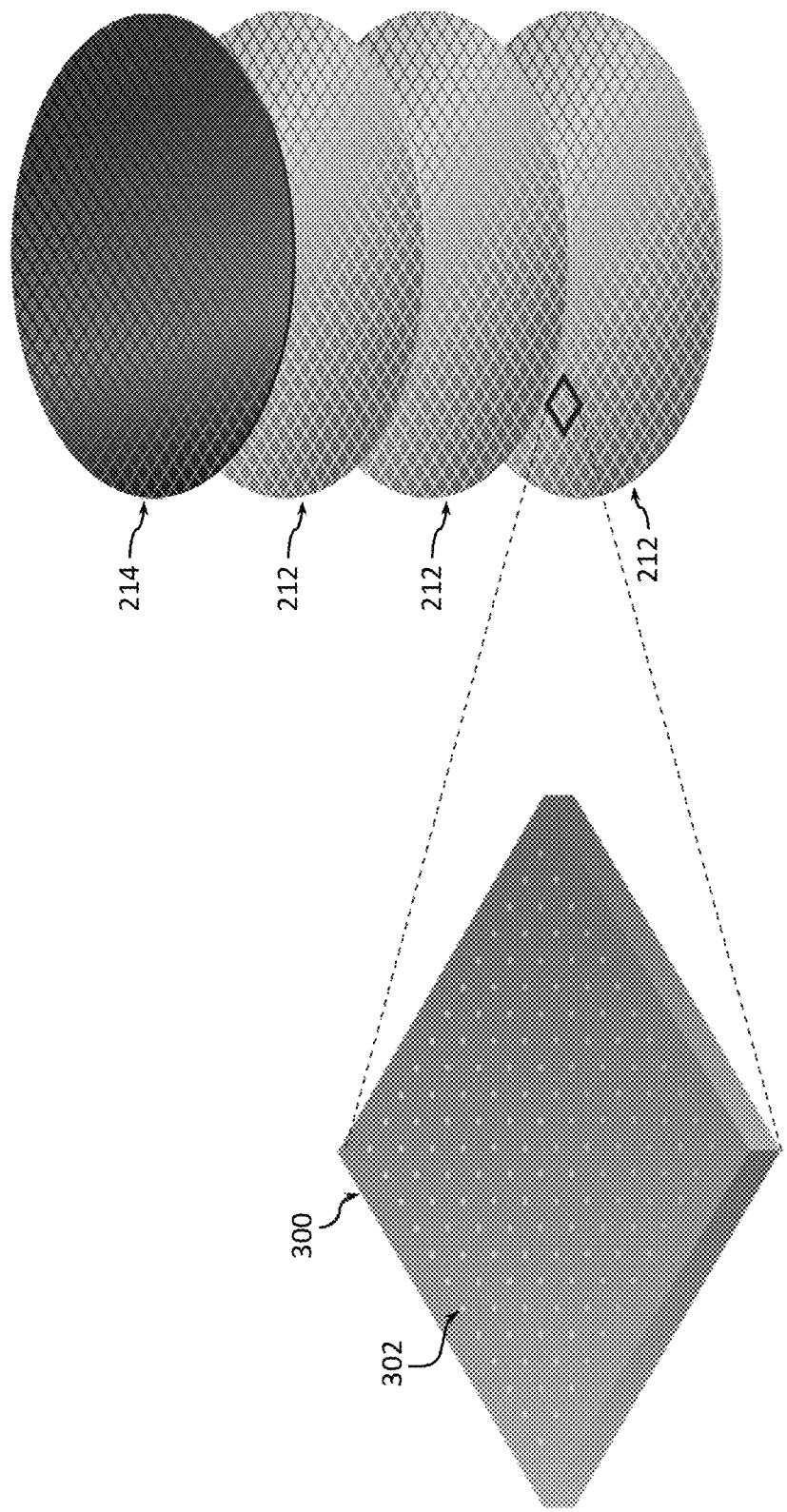
FIG. 3 illustrates an example die of the base memory wafer stack of FIG. 2, in accordance with some embodiments.

Each of the wafers of the base memory wafer stack 200 may be composed of semiconductor material and may include one or more dies having IC structures formed on a surface of the wafers 212, 214 (e.g., one or more dies 300 as shown in FIG. 3). Each of the dies of the wafers 212, 214 may be a repeating unit of a semiconductor product that includes any suitable IC, e.g., an IC implementing memory, an IC implementing compute logic, etc. After the fabrication of the semiconductor product is complete (e.g., after manufacture of one or more of the IC structures to be included in microelectronic assemblies as described herein, e.g., ICs included in the wafers 212, 214 as described herein), the wafers 212, 214 may undergo a singulation process in which the dies of the wafers 212, 214 are separated from one another to provide discrete "chips" of the semiconductor product.

The base memory dies 112 may be implemented in corresponding memory wafers 212, while the base compute die 114 may be implemented in the compute wafer 214. Thus, the memory wafers 212 may serve as a basis for fabricating backend transistors to be used in the base memory dies 112, while the compute wafer 214 may serve as a basis for fabricating frontend transistors to be used in the base compute die 114. Compute wafer 214 and, therefore, the base compute die 114, may include logic used to control the multiple layers of memory (e.g., of the base memory dies 112)—like I/O, memory scheduler etc. This is schematically illustrated in FIG. 3, illustrating an example die 300 of the base memory wafer stack 200 of FIG. 2, in accordance with some embodiments. Since the die 300 is shown in FIG. 3 for one of the memory wafers 212, such a die may be referred to as a "memory chiplet" and may, e.g., be an example of the base memory die 112 of the base structure 110. In particular, since the four wafers 212 and 214 shown in FIG. 3 may correspond to the four dies shown in FIG. 1, the die 300 identified in FIG. 3 may be the bottom base memory die 112 of FIG. 1. Although not shown in FIG. 3 in order to not clutter the drawings, analogous dies 300 may be identified in each of the memory wafers 212 stacked above the bottom memory wafer 212 of FIG. 3, to correspond to the other base memory dies 112 of FIG. 1. Furthermore, another analogous die 300 may be identified in the compute wafer 214 (not shown in FIG. 3 in order to not clutter the drawing). Such a die may be referred to as a "compute chiplet" and may, e.g., be an example of the base compute die 114 of the base structure 110.

FIG. 3 further illustrates signal vias 302 (only one of which is labeled in FIG. 3 with a reference numeral but a plurality of which is shown in FIG. 3 to be arranged in a grid-like manner), which may extend in or through the die 300 in order to communicate signals to, from, or between various IC components (e.g., transistors, resistors, capacitors, interconnects, etc.) of the die 300. For example, the signal vias 302 may communicate signals to/from/between transistors implementing memory cells if the die 300 is a memory chiplet, or to, from, or between transistors implementing compute logic if the die 300 is a compute chiplet.

Figure 4:
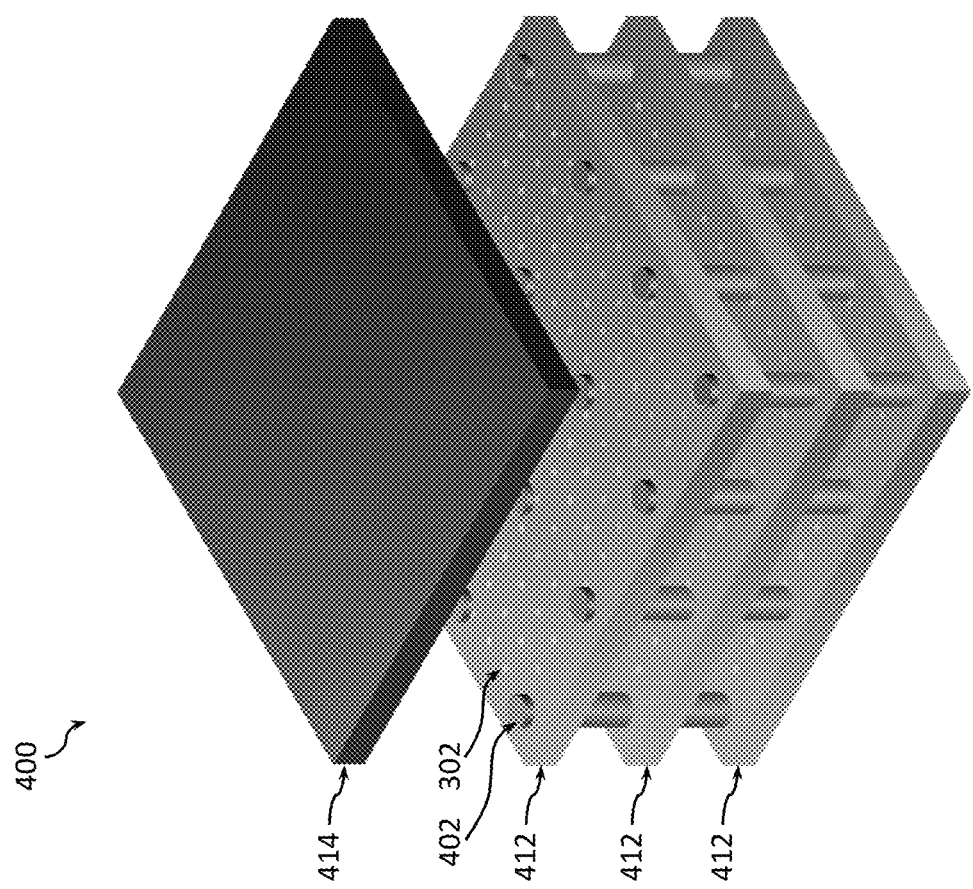
FIG. 4 illustrates an example base memory structure that may be formed on the basis of the dies of the base memory wafer stack of FIG. 2, in accordance with some embodiments.

FIG. 4 illustrates an example base memory structure 400 that may be formed on the basis of the dies 300 from the base memory wafer stack 200 of FIG. 2, in accordance with some embodiments. The base memory structure 400 may be an example of the base structure 110 of FIG. 1. In particular, the base memory structure 400 illustrates a plurality of base memory dies 412 and a base compute die 414. The base memory dies 412 may correspond to (e.g., be an example of) the base compute die 114 of FIG. 1. The base memory dies 412 may be different instances of the dies 300 of different memory wafers 212 of FIG. 2, while the base compute die 414 may be the die 300 of the compute wafer 214 of FIG. 2, described above. Each of the base memory dies 412 may include a plurality of memory cells that include backend transistors, and a base memory die control logic that includes frontend transistors, as described in greater detail below. The base compute die 414 may include a plurality of transistors, e.g., frontend transistors configured to control operation of the base memory dies 412.

Signals vias 302 are shown in FIG. 4 as arrays of small dots in each of the base memory dies 412. In addition, FIG. 4 also illustrates power vias 402 (only one of which is labeled in FIG. 4 with a reference numeral but a plurality of which is shown in FIG. 4 to be arranged in a grid-like manner), which may extend in or through the base memory dies 412 in order to provide power to various IC components of the base memory dies 412, e.g., to various memory cells of the base memory dies 412. Although not specifically shown in FIG. 4, the power vias 402 may further extend to the base compute die 414 to provide power to various IC components of the base compute die 414, e.g., to various logic transistors (e.g., frontend transistors) of the base compute die 414. At least some of the signal vias 302 and the power vias 402 may extend through the hybrid bonding interface between various ones of the base memory dies 412 and the base compute die 414.

FIG. 4 illustrates that, in general, cross-sectional dimensions (e.g., diameters) and a pitch (e.g., defined as a center-to-center distance) of the power vias 402 are larger than cross-sectional dimensions and a pitch of the signal vias 302. For example, in some embodiments, the pitch of the power vias 402 extending through the bonding interface(s) between the base memory die(s) 412 and the base compute die 414 may be between about 10 and 25 micron, e.g., between about 15 and 20 micron, while the pitch of the signal vias 302 may be between about 2 and 12 micron, e.g., between about 4 and 9 micron. In some embodiments, the cross-sectional dimensions (e.g., diameters) of the power vias 402 may be between about 7 and 11 micron, e.g., about 9 micron, while the cross-sectional dimensions of the signal vias 302 may be between about 2 and 4 micron, e.g., about 3 micron. In some embodiments, the cross-sectional dimension may be between about 45%-55% of the pitch.

As described above, in some embodiments, the individual base memory dies 112 and base compute die 114 of the base structure 110 may be hybrid bonded. In some embodiments, hybrid bonding may be performed either on a wafer-level, i.e., the individual wafers 212, 214 may be hybrid bonded before they are separated into dies. In other embodiments, hybrid bonding may be performed on a die-level, i.e., the dies of the individual wafers 212, 214 may be hybrid bonded after the wafers 212, 214 have been separated into dies (e.g., in some embodiments, hybrid bonding may be performed to bond dies 412, 414 shown in FIG. 4, described below). Hybrid bonding will now be described with reference to hybrid bonding of the dies 412, 414, with these descriptions being applicable to both wafer-level and die-level hybrid bonding.

In general, hybrid manufacturing is described herein with reference to a first IC structure (e.g., one of the base memory dies 412) and a second IC structure (e.g., the base compute die 414, or another one of the base memory dies 412) bonded to one another using a bonding material. The first and second IC structures may be fabricated by different manufacturers, using different materials, or different manufacturing techniques. For each IC structure, the terms "bottom face" or "backside" of the structure may refer to the back of the IC structure, e.g., bottom of the support structure of a given IC structure, while the terms "top face" or "frontside" of the structure may refer to the opposing other face. When the top face of the first IC structure is bonded to the top face of the second IC structure, the structures are described as bonded "face-to-face" (f2f). When the top face of the first IC structure is bonded to the bottom face of the second IC structure or the bottom face of the first IC structure is bonded to the top face of the second IC structure, the structures are described as bonded "face-to-back" (f2b). When the bottom face of the first IC structure is bonded to the bottom face of the second IC structure, the structures are described as bonded "back-to-back" (b2b).

In some embodiments, bonding of the faces of the first and second IC structures may be performing using insulator-insulator bonding, e.g., as oxide-oxide bonding, where an insulating material of the first IC structure is bonded to an insulating material of the second IC structure. In some embodiments, a bonding material may be present in between the faces of the first and second IC structures that are bonded together. Such a material is not specifically shown in FIG. 1 but is shown as a bonding material 1240 in the example embodiments of FIG. 12. To that end, the bonding material may be applied to the one or both faces of the first and second IC structures that should be bonded and then the first and second IC structures are put together, possibly while applying a suitable pressure and heating up the assembly to a suitable temperature (e.g., to moderately high temperatures, e.g., between about 50 and 200 degrees Celsius) for a duration of time. In some embodiments, the bonding material may be an adhesive material that ensures attachment of the first and second IC structures to one another. In some embodiments, the bonding material may be an etch-stop material. In some embodiments, the bonding material may be both an etch-stop material and have suitable adhesive properties to ensure attachment of the first and second IC structures to one another. In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface (i.e., the interface between the first and second IC structures) that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC structures together. In addition, an etch-stop material at the interface between the first and second IC structures that includes include silicon, nitrogen, and carbon, where the atomic percentage of any of these materials may be at least 1%, may be advantageous in terms of improving etch-selectivity of this material with respect to etch-stop materials that may be used in different of the first and second IC structures.

In some embodiments, no bonding material may be used, but there will still be a bonding interface resulting from the bonding of the first and second IC structures to one another. Such a bonding interface may be recognizable as a seam or a thin layer in the microelectronic assembly, using, e.g., selective area diffraction (SED), even when the specific materials of the insulators of the first and second IC structures that are bonded together may be the same, in which case the bonding interface would still be noticeable as a seam or a thin layer in what otherwise appears as a bulk insulator (e.g., bulk oxide) layer.

In some embodiments, one or more of the signal vias 302 or the power vias 402 may be provided after the dies 412, 414 have been hybrid bonded. In such embodiments, the one or more of the signal vias 302 or the power vias 402 provided after the hybrid bonding may extend from one face of the base memory structure 400 (e.g., from the bottom face of the bottom one of the base memory dies 412, shown at the bottom of FIG. 4), towards, the other face of the base memory structure 400 (e.g., towards the top face of the base compute die 414, shown at the top of FIG. 4), and may extend through one or more bonding interfaces between these dies, to provide signal and/or power to various IC components (e.g., transistors) of the dies 412, 414.

Figure 5:
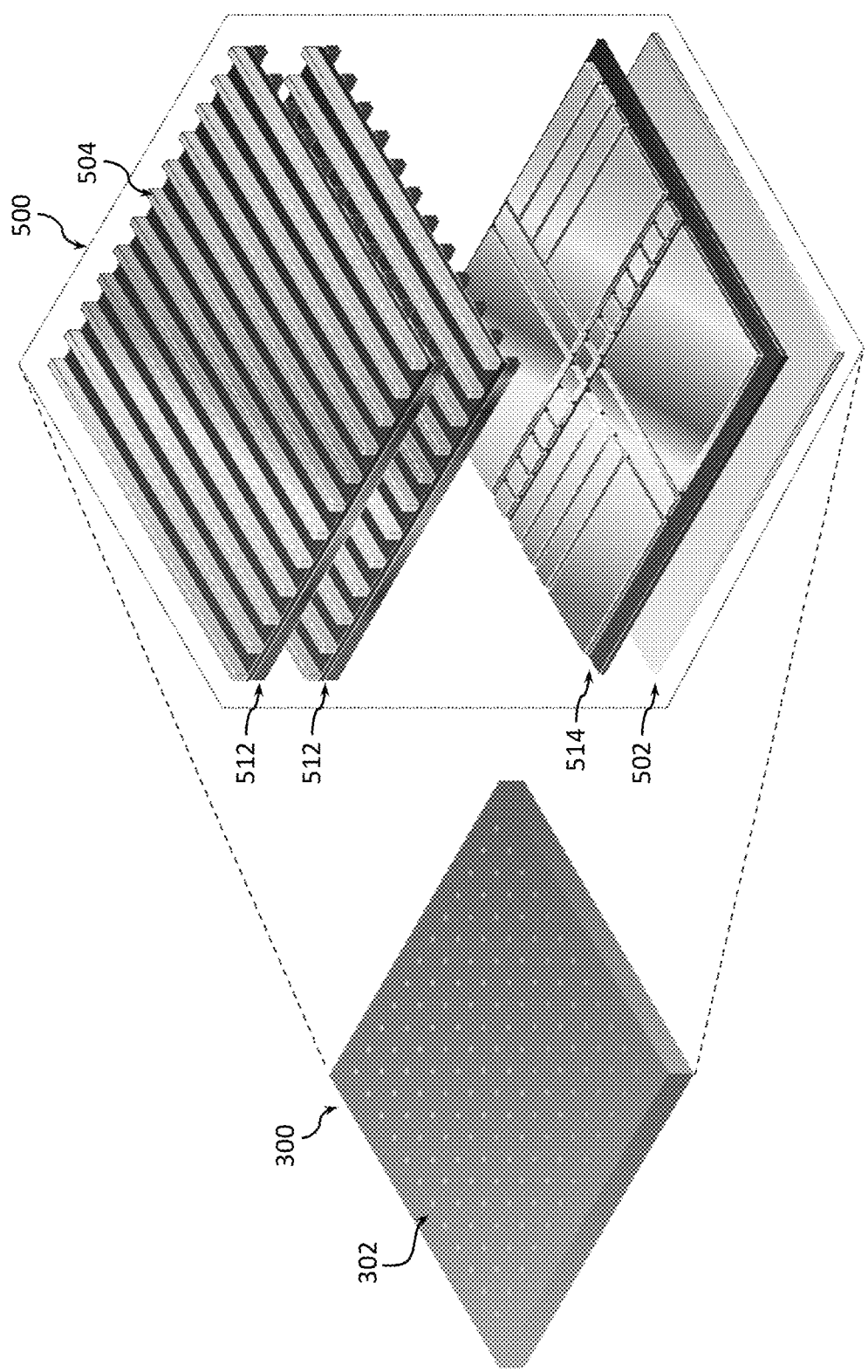
FIG. 5 illustrates an example memory die of the base memory structure of FIG. 4, in accordance with some embodiments.

FIG. 5 illustrates an example memory die 500 of the base memory structure 400 of FIG. 4, in accordance with some embodiments. For example, the memory die 500 may be any of the base memory dies 412. Thus, the memory die 500 may be any of the base memory dies 112 of the microelectronic assembly 100 shown in FIG. 1. As shown in FIG. 5, the memory die 500 may include a support structure (e.g., a substrate, a chip, or a die) 502, a FEOL layer 514 and a plurality of BEOL layers 512.

The support structure 502 may be a semiconductor substrate composed of semiconductor material systems including, for example, N-type or P-type materials systems. In one implementation, the support structure 502 may be a crystalline substrate formed using a bulk silicon or a silicon-on-insulator (SOI) substructure. In other implementations, the support structure 502 may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the support structure 502 may be non-crystalline. In some embodiments, the support structure 502 may be a PCB substrate. Although a few examples of materials from which the support structure 502 may be formed are described here, any material that may serve as a foundation upon which IC devices of the memory die 500 as described herein may be built falls within the spirit and scope of the present disclosure.

Some or all of the BEOL layers 512 may include backend transistors forming memory cells (e.g., DRAM cells) in different backend layers above the support structure 502. The FEOL layer 514 may include a plurality of frontend transistors forming control logic configured to control operation of (e.g., to control input/output or read/write to) the memory cells of the BEOL layers 512. Thus, arrangement of the memory die 500 may be referred to as "compute-under-array" because the compute logic needed to control the memory array is implemented in the FEOL layer 514, which is under the memory array implemented by the memory cells of the BEOL layers 512. The memory control logic implemented in the FEOL layer 514 may, e.g., include logic transistors configured to form sense amplifiers, multipliers, CMOS logic, and possibly SRAM devices configured to control operation of the memory cells of the BEOL layers 512.

FIG. 5 schematically illustrates a plurality of structures of a channel material 504, based on which the backend transistors may be formed in the BEOL layers 512. In some embodiments, the channel material 504 may be composed of semiconductor material systems including, for example, N-type or P-type materials systems. In some embodiments, the channel material 104 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 104 may include a combination of semiconductor materials where one semiconductor material may be used for a channel portion of a transistor and another material, sometimes referred to as a "blocking material," may be used between the channel portion and the support structure over which the transistor is provided. In some embodiments, the channel material 504 may include a monocrystalline semiconductor, such as silicon (Si) or germanium (Ge). In some embodiments, the channel material 504 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistors implemented in the BEOL layers 512 are N-type metal oxide semiconductor (NMOS) transistors), the channel portions of the channel material 504 may advantageously include a III-V material having a high electron mobility, such as, but not limited to InGaAs, InP, InSb, and InAs. For some such embodiments, the channel portions of the channel material 504 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portions of the channel material 504 may be an intrinsic III-V material, i.e., a III-V semiconductor material not intentionally doped with any electrically active impurity. In alternate embodiments, a nominal impurity dopant level may be present within the channel portions of the channel material 504, for example to further fine-tune a threshold voltage Vt, or to provide HALO pocket implants, etc. Even for impurity-doped embodiments however, impurity dopant level within the channel portions of the channel material 504 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistors implemented in the BEOL layers 512 are P-type metal oxide semiconductor (PMOS) transistors), the channel portions of the channel material 504 may advantageously be a group IV material having a high hole mobility, such as, but not limited to Ge or a Ge-rich SiGe alloy. For some example embodiments, the channel portions of the channel material 504 may have a Ge content between 0.6 and 0.9, and advantageously may be at least 0.7. In some embodiments with highest mobility, the channel portions of the channel material 504 may be intrinsic III-V (or IV for P-type devices) material and not intentionally doped with any electrically active impurity. In alternate embodiments, one or more a nominal impurity dopant level may be present within the channel material 504, for example to further set a threshold voltage (Vt), or to provide HALO pocket implants, etc. Even for impurity-doped embodiments however, impurity dopant level within the channel portions of the channel material 504 is relatively low, for example below $10^{15}$ cm$^{-3}$, and advantageously below $10^{13}$ cm$^{-3}$.

In some embodiments, the transistors implemented in the BEOL layers 512 may be thin film transistors (TFTs). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If transistors implemented in the BEOL layers 512 are TFTs, the channel material 504 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, for TFTs, the channel material 504 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 504 may have a thickness between about 5 and 75 nanometers, including all values and ranges therein. In some embodiments, a thin film channel material 504 may be deposited at relatively low temperatures, which allows depositing the channel material 504 within the thermal budgets imposed on backend fabrication to avoid damaging other components, e.g., frontend components such as the logic devices of the FEOL layer 514.

Figure 6:
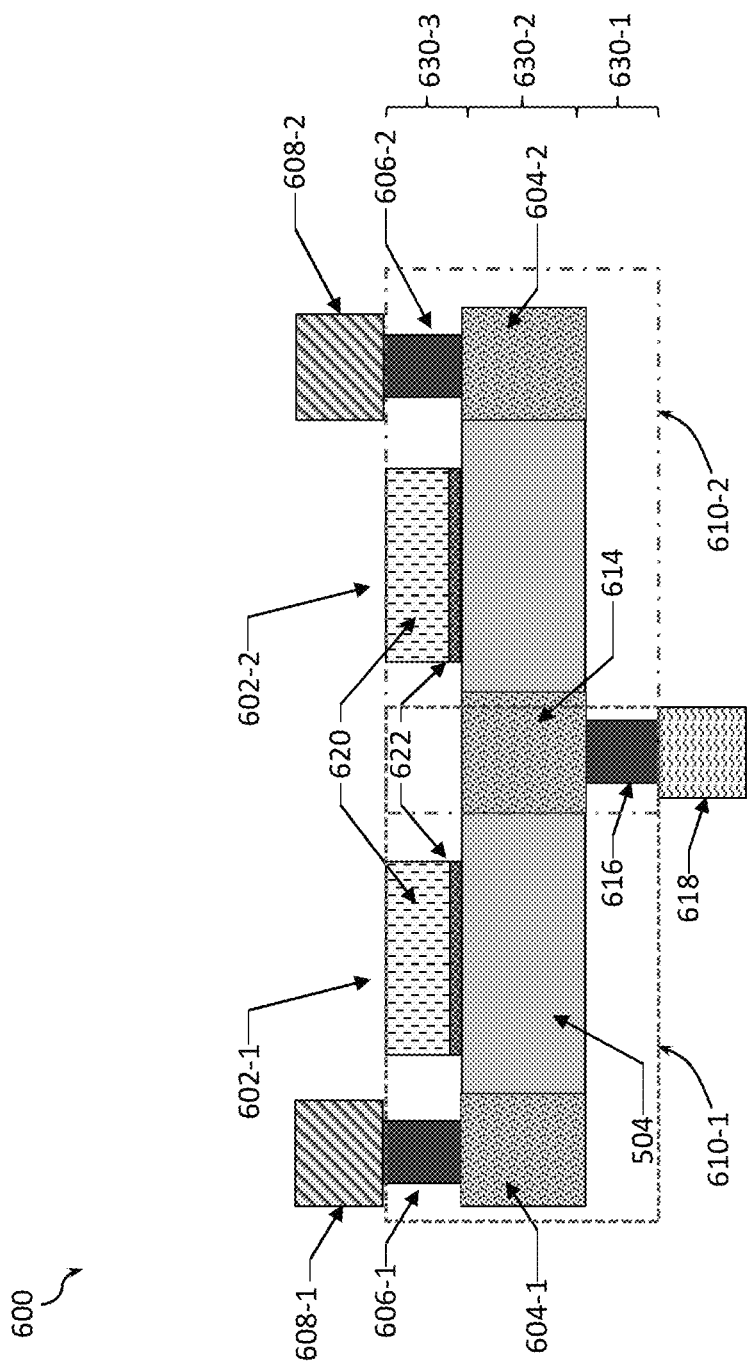
FIG. 6 provides a schematic illustration of a cross-sectional side view of a shared-contact memory cell that may be implemented in a memory die, in accordance with some embodiments.

FIG. 6 provides a schematic illustration of a cross-sectional side view of a shared-contact memory cell 600 that may be implemented in a memory die, in accordance with some embodiments. For example, in some embodiments, the memory cell 600 may be implemented as any of the memory cells of the BEOL layers 512. Therefore, the channel material of the memory cell 600 is referred to as the channel material 504 that was shown in FIG. 5 and described above. However, in general, the channel material 504 as described above may be used for any of the transistors described in the present disclosure, including frontend transistors, e.g., any of the transistors of the compute dies described herein. Furthermore, in general, memory arrays of cells such as the memory cell 600 may be implemented in any of the memory dies described herein, e.g., in the base memory dies 112 or in the stack memory dies 122.

Dashed and dash-dotted contours shown in FIG. 6 are intended to illustrate components belonging to transistors 610-1 and 610-2, respectively. As shown in FIG. 6, the transistors 610-1 and 610-2 may be provided over a continuous layer of a channel material, e.g., the channel material 504. Each of the transistors 610 may include a respective instance of a gate stack 602, a first source or drain (S/D) region 604, a first S/D contact 606, and a storage capacitor 608 coupled to the first S/D contact 606 (respective instances of analogous elements for different transistors 610-1 and 610-2 are shown in FIG. 6 with different reference numerals after the dash, e.g., a gate stack 602-1 for the transistor 610-1 and a gate stack 602-2 for the transistor 610-2). As further shown in FIG. 6, the transistors 610 have a shared second S/D region 614, and a shared second S/D contact 616. Furthermore, a bitline 618 may be coupled to the shared second S/D contact 616, as also shown in FIG. 6.

Each gate stack 602 may include a gate electrode 620 and, optionally, a gate dielectric 622. The gate electrode 620 may include at least one P-type work function metal or N-type work function metal, depending on whether the transistor 610 is a PMOS transistor or an NMOS transistor. For a PMOS transistor, metals that may be used for the gate electrode 620 may include, but are not limited to, ruthenium, palladium, platinum, cobalt, nickel, and conductive metal oxides (e.g., ruthenium oxide). For an NMOS transistor, metals that may be used for the gate electrode 620 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 620 may include a stack of two or more metal layers, where one or more metal layers are workfunction metal layers and at least one metal layer is a fill metal layer. Further metal layers may be included for other purposes, such as to act as a diffusion barrier layer, described below.

If used, the gate dielectric 622 may at least laterally surround the channel portion of the channel material 504, and the gate electrode 620 may laterally surround the gate dielectric 622 such that the gate dielectric 622 is disposed between the gate electrode 620 and the channel material 504. In various embodiments, the gate dielectric 622 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 622 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 622 during manufacture of the transistor 610 to improve the quality of the gate dielectric 622. In some embodiments, the gate dielectric 622 may have a thickness between about 0.5 nanometers and 3 nanometers, including all values and ranges therein, e.g., between about 1 and 3 nanometers, or between about 1 and 2 nanometers.

In some embodiments, the gate dielectric 622 may be a multilayer gate dielectric, e.g., it may include any of the high-k dielectric materials in one layer and a layer of IGZO. In some embodiments, the gate stack 602 may be arranged so that the IGZO is disposed between the high-k dielectric and the channel material 504. In such embodiments, the IGZO may be in contact with the channel material 504 and may provide the interface between the channel material 504 and the remainder of the multilayer gate dielectric 622. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

In some embodiments, the gate stack 602 may be surrounded by a dielectric spacer, not specifically shown in FIG. 6. The dielectric spacer may be configured to provide separation between the gate stacks 602 of different transistors 610 which may be provided adjacent to one another (e.g., different transistors 610 provided along a single fin if the transistors 610 are FinFETs), as well as between the gate stack 602 and one of the S/D contacts 606 that is disposed on the same side as the gate stack 602. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

As shown in FIG. 6, for each of the transistors 610-1 and 610-2, a first S/D region 604-1 and a second S/D region 614 may be included on either side of their respective gate stack 602, thus realizing a transistor. As is known in the art, source and drain regions (also sometimes interchangeably referred to as "diffusion regions") are formed for the gate stack of a FET. In some embodiments, the S/D regions 604, 614 may be regions of doped semiconductors, e.g., regions of the channel material 504 (e.g., of the channel portion) doped with a suitable dopant to a desired dopant concentration, so as to supply charge carriers for the transistor channel. In some embodiments, the S/D regions 604, 614 may be highly doped, e.g., with dopant concentrations of about $1 \cdot 10^{21}$ cm$^{-3}$, in order to advantageously form Ohmic contacts with the respective S/D contacts 606, 616, although, in other embodiments, these regions may also have lower dopant concentrations and may form Schottky contacts in some implementations. Irrespective of the exact doping levels, the S/D regions 604, 614 of the transistor 610 may be the regions having dopant concentration higher than in other regions, e.g., higher than a dopant concentration in a region of the channel material 504 between the first S/D region 604-1 and the second S/D region 614, and, therefore, may be referred to as "highly doped" (HD) regions. In some embodiments, the S/D regions 604, 614 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 504 to form the S/D regions 604, 614. An annealing process that activates the dopants and causes them to diffuse further into the channel material 504 may follow the ion implantation process. In the latter process, the one or more semiconductor materials of the channel material 504 may first be etched to form recesses at the locations for the future S/D regions. An epitaxial deposition process may then be carried out to fill the recesses with material (which may include a combination of different materials) that is used to fabricate the S/D regions 604, 614. In some implementations, the S/D regions 604, 614 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 604, 614 may be formed using one or more alternate semiconductor materials such as germanium or a group III-V material or alloy. Although FIG. 6 illustrates the first and second S/D regions 604, 614 with a single pattern, suggesting that the material composition of the first and second S/D regions 604, 614 is the same, this may not be the case in some other embodiments of the transistor 610. Thus, in some embodiments, the material composition of the first S/D region 604 may be different from the material composition of the second S/D region 614.

As further shown in FIG. 6, S/D contacts 606 and 616 (together referred to as "S/D contacts 606, 616"), formed of one or more electrically conductive materials, may be used for providing electrical connectivity to the S/D regions 604, 614, respectively. In various embodiments, one or more layers of metal and/or metal alloys may be used to form the S/D contacts 606, 616. For example, the electrically conductive materials of the S/D contacts 606, 616 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 606, 616 may include one or more electrically conductive alloys, oxides, or carbides of one or more metals. In some embodiments, the S/D contacts 606, 616 may include a doped semiconductor, such as silicon or another semiconductor doped with an N-type dopant or a P-type dopant. Metals may provide higher conductivity, while doped semiconductors may be easier to pattern during fabrication. Although FIG. 6 illustrates the first and second S/D contacts 606, 616 with a single pattern, suggesting that the material composition of the first and second S/D contacts 606, 616 is the same, this may not be the case in some other embodiments of the transistor 610. Thus, in some embodiments, the material composition of the first S/D contact 606 may be different from the material composition of the second S/D contact 616.

In stark contrast to conventional implementations where both S/D contacts are typically provided on a single side of a transistor, typically on the front side, e.g., where the gate stack 602 is provided, the shared S/D contact 616 is provided on a different sides from the S/D contacts 606. Namely, as shown in FIG. 6, the first S/D contact 606 for each of the transistors 610 is provided on the same side as the gate stack 602, which may be considered to be the frontside of the transistors 610, while the shared second S/D contact 616 (shared between the two transistors 610) is provided on the opposite side, which may be considered to be the backside of the transistors 610. Thus, the first S/D contact 606 of each of the transistors 610 is the frontside contact and the shared second S/D contact 616 is the backside contact for both of the transistors 610. If considering the layers above a support structure, e.g., the support structure 502 shown in FIG. 5, over which the transistors 610 are built, then the shared second S/D contact 616 may be considered to be in a first layer 630-1 above the support structure, a portion of the channel material 504 between the first S/D region 604 and the second S/D region 614 (e.g., the channel portion) of each of the transistors 610 may be considered to be in a second layer 630-2 above the support structure, and the respective first S/D contacts 606 is in a third layer 630-3 over the support structure. As can be seen from FIG. 6, the second layer 630-2 is between the first layer 620-1 and the third layer 630-3. At least a portion of the gate stack 602, or a contact to the gate stack 602 (such a gate contact not specifically shown in FIG. 6), may be provided in the same layer as one of the S/D contacts 606, 616, e.g., in the third layer 630-3, as shown in FIG. 6.

Transistors having one frontside and one backside S/D contacts as described herein, such as the transistors 610, may be implemented using any suitable transistor architecture, e.g., planar or non-planar architectures. In some embodiments, the transistors may be FinFETs or nanoribbon transistors.

FinFETs refer to transistors having a non-planar architecture where a fin, formed of one or more semiconductor materials, extends away from a base (where the term "base" refers to any suitable support structure on which a transistor may be built, e.g., a substrate). A portion of the fin that is closest to the base may be enclosed by an insulator material. Such an insulator material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode material and, optionally, a layer of a gate dielectric may be provided over the top and sides of the remaining upper portion of the fin (i.e. the portion above and not enclosed by the STI), thus wrapping around the upper-most portion of the fin. The portion of the fin over which the gate stack wraps around is typically referred to as a "channel portion" of the fin because this is where, during operation of the transistor, a conductive channel forms, and is a part of an active region of the fin. A source region and a drain region are provided on the opposite sides of the gate stack, forming, respectively, a source and a drain terminal of a transistor. FinFETs may be implemented as "tri-gate transistors," where the name "tri-gate" originates from the fact that, in use, such transistors may form conducting channels on three "sides" of the fin. FinFETs potentially improve performance relative to single-gate transistors and double-gate transistors.

Nanoribbon transistors refer to transistors having a non-planar architecture where a channel material is formed as a nanoribbon/nanowire and a gate stack at least partially, or completely, wraps around a portion of the channel material (i.e., the channel portion). Nanoribbon transistors may be implemented as "all-around-gate transistors," where the name "all-around-gate" originates from the fact that, in use, such transistors may form conducting channels on all "sides" of the nanoribbon. Nanoribbon transistors potentially improve performance relative to single-gate transistors and double-gate transistors. As used herein, the term "nanoribbon" refers to an elongated semiconductor structure having a long axis substantially parallel to a support structure (e.g., a substrate, a chip, or a wafer) over which a transistor is provided. In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section. In the present disclosure, the term "nanoribbon" is used to describe both such nanoribbons and such nanowires, as well as elongated semiconductor structures with a longitudinal axis parallel to the support structures and with having transverse cross-sections of any geometry (e.g., oval, or a polygon with rounded corners).

In some embodiments, as shown in FIG. 6, the storage capacitor 608 may be coupled to the frontside S/D contact 606, for each of the transistors 610, while the shared bitline 618 may be coupled to the backside S/D contact 616 shared by the transistors 610. The storage capacitor 608 may be any suitable capacitor, e.g., a metal-insulator-metal (MIM) capacitor for storing a bit value, or a memory state (e.g., logical "1" or "0") of the memory cell 600. By coupling one electrode of the storage capacitor 608 to the S/D region 604 (via the S/D contact 606), the storage capacitor 608 is configured to store the memory state of the memory cell 600. In some embodiments, the storage capacitor 608 may be coupled to the S/D region 604 via a storage node (not specifically shown in FIG. 6) coupled to the S/D region 604. In some embodiments, the S/D contact 606 may be considered to be the storage node.

Figure 7:
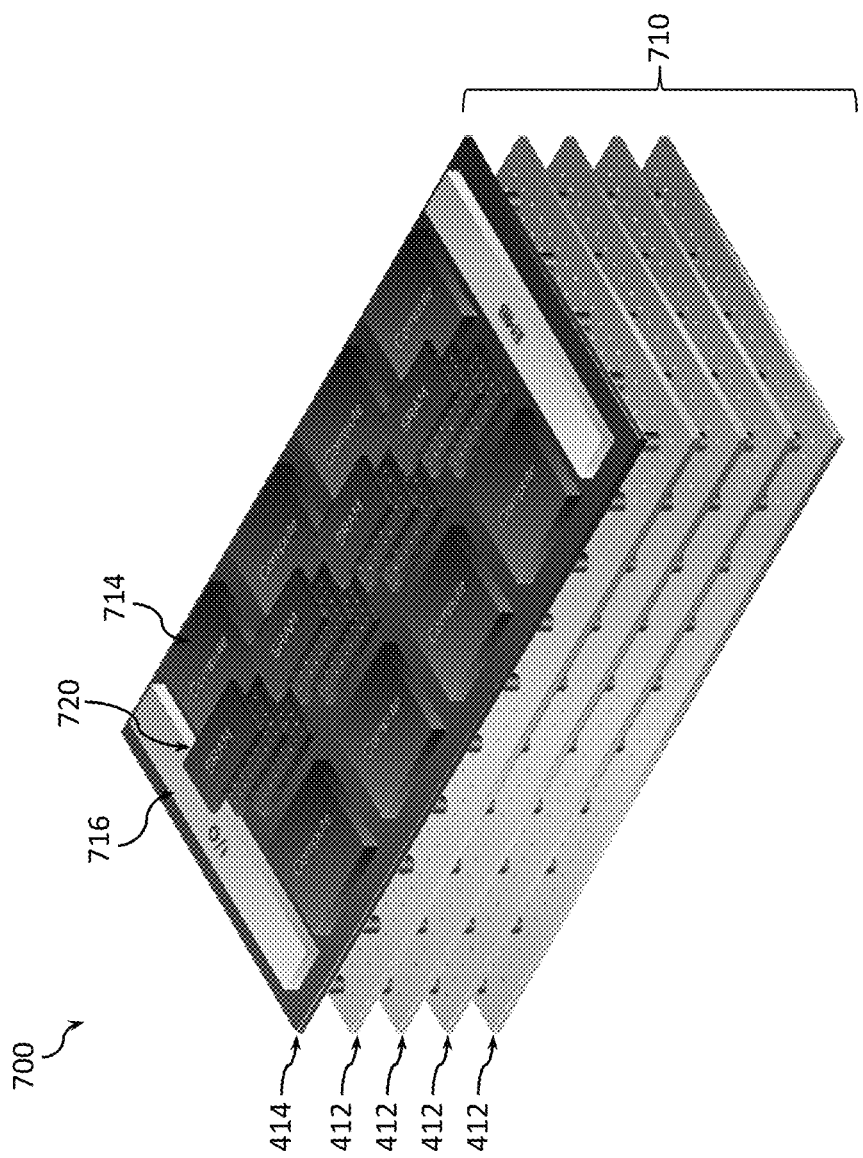
FIG. 7 provides a schematic illustration of a perspective view of a microelectronic assembly with a base structure and one or more stacks of one or more of memory and/or compute dies that may be stacked over the base structure, in accordance with some embodiments.

FIG. 7 provides a schematic illustration of a perspective view of a microelectronic assembly 700 with a base structure 710 and one or more stacks 720 of one or more of memory and/or compute dies that may be stacked over the base structure 710, in accordance with some embodiments. The microelectronic assembly 700 may be an example embodiment of the microelectronic assembly 100. The base structure 710 may be an example of the base structure 110 as described above. For example, the base structure 710 may include the memory dies 412 and the compute die 414 as described above. The compute die 414 may include a plurality of circuits, e.g., one or more compute circuits 714 and/or I/O circuits 716, which may be implemented as individual ICs of the compute die 714 or be additional dies bonded to the compute die 414, e.g., using hybrid bonding. The circuits 714, 716 may be implemented with frontend transistors, as described above. FIG. 7 further illustrates four stacks 720, each of which may be an example implementation of any of the stacks 120, described above. In some embodiments, one or more of the stacks 720 may include memory dies 122 with SRAM arrays.

Nano-TSVs with 3D Monolithic Memory

Figure 8:
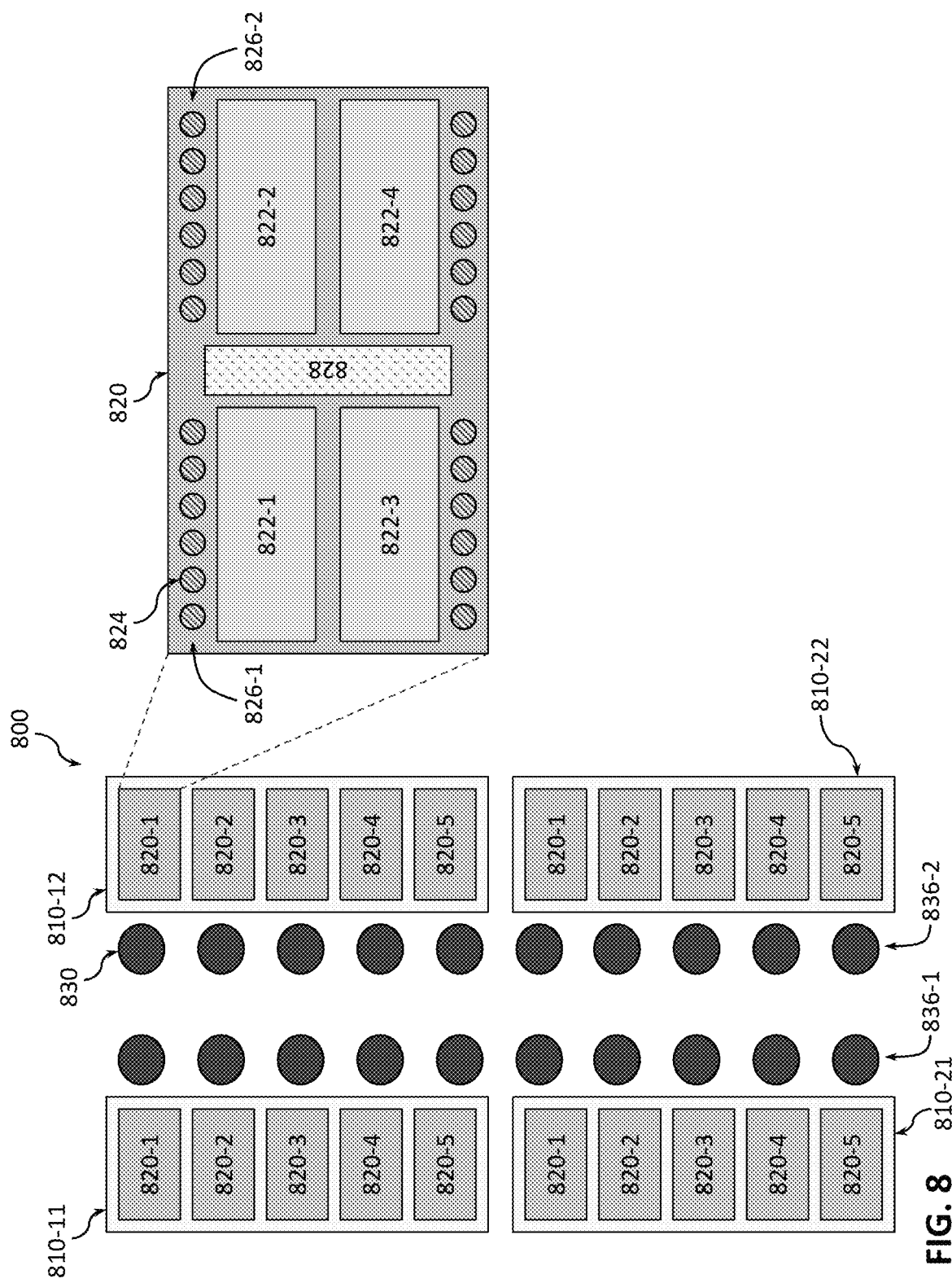
FIG. 8 provides a schematic illustration of a top-down view of a memory die of a microelectronic assembly, in accordance with some embodiments.

FIG. 8 provides a schematic illustration of a top-down view of a memory die 800 of a microelectronic assembly, in accordance with some embodiments. For example, in some embodiments, the memory die 800 may be the base memory die 112 or 412, as described above. In other embodiments, the memory die 800 may be the stack memory die 122, as described above.

As shown in FIG. 8, the memory die 800 may include one or more (typically, a plurality of) data blocks 810. The data blocks 810 are shown in the example of FIG. 8 as four data blocks 810 arranged in a 2×2 array and individually labeled with a reference numeral after a dash that indicates the row and the column of each data block 810. However, in other embodiments of the memory die 800, the number and the relative arrangement of the data blocks 810 may be different.

As further shown in FIG. 8, a given data block 810 may include one or more (typically, a plurality of) memory array circuits 820. Each of the data blocks 810 of FIG. 8 is shown as having five memory array circuits 820, individually labeled with a reference numeral after a dash that indicates the number of the memory array circuit 820 within a given data block 810. However, in other embodiments of the memory die 800, the number and the relative arrangement of the memory array circuits 820 within any of the data blocks 810 may be different from what is shown in FIG. 8, and in various embodiments, different data blocks 810 may include different numbers of the memory array circuits 820.

As also shown in FIG. 8, a given memory array circuit 820 may include one or more (typically, a plurality of) memory arrays 822. This is shown in FIG. 8 with an example detailed illustration of the memory array circuit 820-1 of the data block 810-12 having four memory arrays 822, individually labeled with a reference numeral after a dash that indicates the number of the memory array 822 within a given memory array circuit 820. However, in other embodiments of the memory die 800, the number and the relative arrangement of the memory arrays 822 within any of the memory array circuits 820 may be different from what is shown in FIG. 8, and in various embodiments, different memory array circuits 820 may include different numbers of the memory arrays 822. Each of the memory arrays 822 may include any of the memory cells described herein. For example, in some embodiments, the memory arrays 822 may include DRAM cells, SRAM cells, etc. In some embodiments, the memory arrays 822 may include memory cells that include backend transistors as described herein, e.g., the memory cells 600. In other embodiments, the memory arrays 822 may include memory cells that include frontend transistors, or memory cells that include some combination of backend and frontend transistors.

FIG. 8 further illustrates that the memory array circuit 820 may also include a plurality of signal vias 824 associated with the memory arrays 822 by being configured to communicate signals to/from/between various IC components of the memory arrays 822. In some embodiments, the signal vias 824 may be the signal vias 302, described above. In some embodiments, a different subset of the signal vias 824 may be associated with each of the memory arrays 822 of a given memory array circuit 820. For example, as shown in FIG. 8, a group 826-1 may include a plurality of vias 824 (e.g., five vias 824) associated with the memory array 822-1, a group 826-2 may include a plurality of vias 824 (e.g., five vias 824) associated with the memory array 822-2, a group 826-3 may include a plurality of vias 824 (e.g., five vias 824) associated with the memory array 822-3, and a group 826-4 may include a plurality of vias 824 (e.g., five vias 824) associated with the memory array 822-4. In some embodiments, a given group 826 of signals vias 824 may be arranged in a line provides in the vicinity of a corresponding memory array 822, as is shown in FIG. 8. In some embodiments, the lines of different groups 826 of the signal vias 824 may be arranged substantially parallel to one edge of a corresponding memory array 822.

As further shown in FIG. 8, the memory array circuit 820 may also include control circuitry 828, associated with and configured to control one or more of the memory arrays 822 of the memory array circuit 820. For example, the control circuitry 828 may include one or more of wordlines or wordline controllers and/or bitlines or bitline controllers for the memory cells of the memory arrays 822.

FIG. 8 further illustrates that the memory array circuit 820 may also include a plurality of power vias 830 associated with the data blocks 810 by being configured to provide power to various IC components of the data blocks 810 (e.g., to various components of the memory arrays 822). In some embodiments, the power vias 830 may be the power vias 402, described above. In some embodiments, a different subset of the power vias 830 may be associated with one or more of the data blocks 810. For example, as shown in FIG. 8, a group 836-1 may include a plurality of power vias 830 (e.g., 10 power vias 830) associated with the data blocks 810-11 and 810-21, while a group 836-2 may include a plurality of power vias 830 (e.g., 10 power vias 830) associated with the data blocks 810-12 and 810-22. In some embodiments, a given group 836 of the powers vias 830 may be arranged in a line provides in the vicinity of the corresponding one or more data blocks 810, as is shown in FIG. 8. In some embodiments, the lines of different groups 836 of the power vias 830 may be arranged substantially parallel to one edge of the corresponding data blocks 810.

In some embodiments, the pitches and the relative dimensions of the adjacent power vias 830 and of adjacent signal vias 824 may be different, e.g., as was described above with reference to the power vias 402 and the signal vias 302. In general, cross-sectional dimensions (e.g., diameters) and pitches of the power vias 830 may be larger than those of the signal vias 824. For example, the pitch of the plurality of power vias 830 (e.g., of those provided along one of the lines associated with one of the groups 836) may be between about 10 and 25 micron, e.g., between about 15 and 20 micron, and the pitch of the plurality of signal vias 824 (e.g., of those belonging to a given group 826) may be between about 2 and 12 micron, e.g., between about 4 and 9 micron.

In some embodiments, in the plane of the memory die 800, the lines associated with one of the groups 826 in which the signal vias 824 are arranged may be substantially perpendicular to the lines associated with one of the groups 836 in which the power vias 830 are arranged. An example of this is illustrated in FIG. 8. However, in other embodiments, the relative arrangements of the signal vias 824 and the power vias 830 may be different from what is shown in FIG. 8.

Although not specifically illustrated in FIG. 8 because FIG. 8 provides a top-down view, the signal vias 824 and the power vias 830 may be TSVs, configured to route signals and power between multiple dies stacked together, either by hybrid bonding or by using DTD interconnects as described herein.

Die Stitching

In some embodiments, any of the dies described herein, e.g., any of the base memory dies 112, 412, or the stack memory dies 122 may be a collection of dies attached to one another side by side (i.e., laterally), so that all of the dies of the collection are provided in a single plane, and look and act as, effectively, a single die. In such embodiments, it may be desirable to electrically couple one or more components (e.g., one or more interconnects or IC structures such as memory cells) of one of the dies of the plane with one or more components of another one of the dies of the plane. Die stitching described herein refers to providing metal lines (e.g., electrically conductive wires) that cross over different dies of a given plane.

Figure 9:
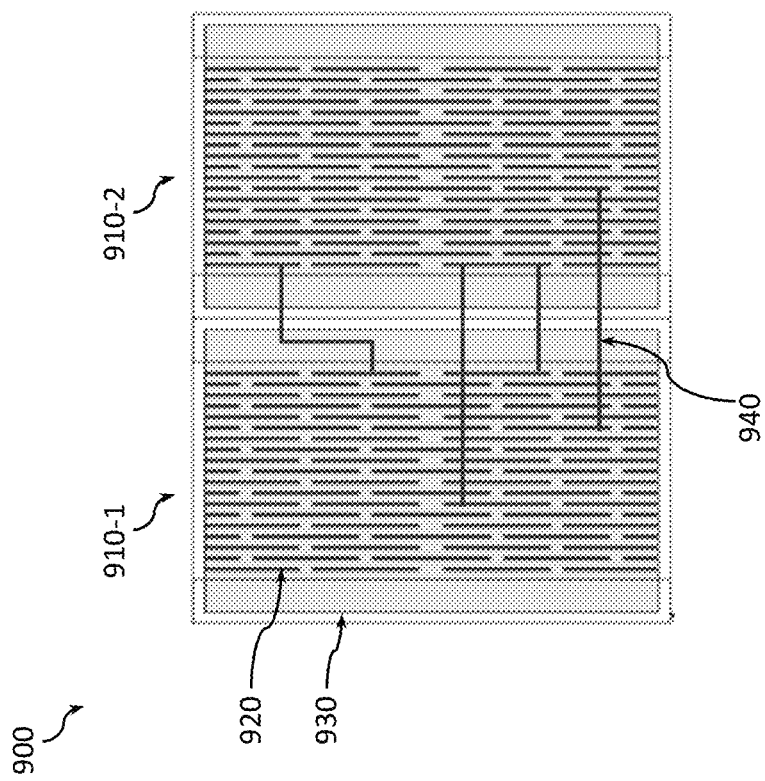
FIG. 9 provides a first example illustration of a top-down view of a stitched die of a microelectronic assembly, in accordance with some embodiments.

FIG. 9 provides a first example illustration of a top-down view of a stitched die 900 of a microelectronic assembly, in accordance with some embodiments. For example, in some embodiments, the stitched die 900 may be the base memory die 112 or 412, as described above. In other embodiments, the stitched die 900 may be the stack memory die 122, as described above. In still other embodiments, the stitched die 900 may be the base compute die 114 or the stack compute die 124, as described above.

Figure 10B:
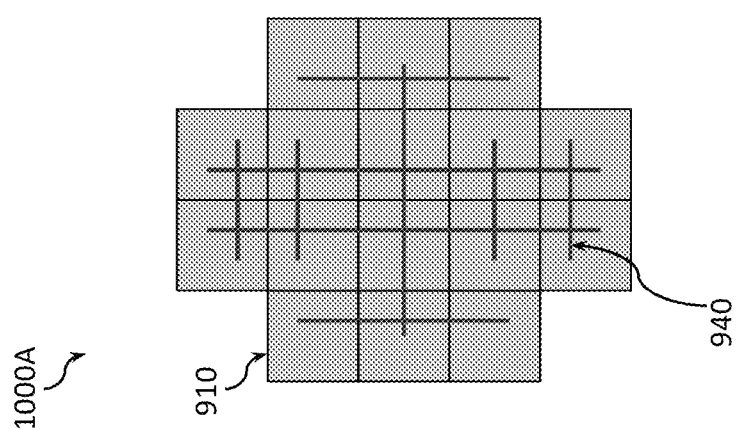
FIGS. 10A and 10B provide additional example illustrations of top-down view of stitched dies of a microelectronic assembly, in accordance with some embodiments.

As shown in FIG. 9, the stitched die 900 may include a first and a second dies 910-1, 910-2. Each of the dies 910 may include a plurality of metal lines 920 (only one of which is labeled in FIG. 9, for only one of the dies 910, in order to not clutter the drawing, but a plurality of such lines are shown in each of the dies 910 as vertical lines). Each of the dies 910 may further include a scribe street 930 (labeled for only one of the dies 910 of FIG. 9 in order to not clutter the drawing), which is an area, typically at a periphery of a die, where no interconnects (e.g., no metal lines) are present. Although FIG. 9 illustrates the dies 910 to be substantially aligned with respect to one another so that at least some of their edges are aligned, this does not have to be so in other embodiments. For example, in some embodiments of die stitching, the dies to be stitched may be provided in a single plane but staggered or offset with respect to one another, e.g., as illustrated in FIG. 10B.

The metal lines 920 of the first die 910-1 may be used to communicate signals and/or power to/from/between various IC components of the first die 910-1. The metal lines 920 of the second die 910-2 may be used to communicate signals and/or power to/from/between various IC components of the second die 910-2. Any of the metal lines 920 of any of the dies 910 may be coupled to any of the signal vias and power vias as described herein, e.g., to any of the signal vias 302 and power vias 402 as described above.

FIG. 9 further illustrates metal lines 940 (only one of which is labeled in FIG. 9 in order to not clutter the drawing, but a plurality of such lines are shown between the dies 910 as horizontal lines) that may be used to cross between the different dies 910 to electrically couple one or more of the metal lines 920 of the first die 910-1 and one or more of the metal lines 920 of the second die 910-2. For example, said coupling may be realized by having one or more electrically conductive materials of the stitch metal lines 940 being in contact with one or more electrically conductive materials of the one or more of the metal lines 920 of the first die 910-1 and the one or more of the metal lines 920 of the second die 910-2. To differentiate between the metal lines within a single die from metal lines crossing over two or more dies, the former may be referred to as "die metal lines" and the latter may be referred to as "stitch metal lines." The stitch metal lines 940 may be used to communicate signals and/or power to/from/between various IC components of the first die 910-1 and various IC components of the second die 910-2. Any of the stitch metal lines 940 may be coupled to any of the signal vias and power vias as described herein, e.g., to any of the signal vias 302 and power vias 402 as described above. For example, said coupling may be realized by having one or more electrically conductive materials of the stitch metal lines 940 being in contact with one or more electrically conductive materials of the signal vias 302 and power vias 402.

In some embodiments, the stitch metal lines 940 may be arranges as lines extending in directions that are substantially perpendicular to directions of the die metal lines 920 of the first die 910-1 and/or directions of the die metal lines 920 of the second die 910-2. For example, FIG. 9 illustrates that some of the stitch metal lines 940 may be substantially perpendicular to, both, the directions of the die metal lines 920 of the first die 910-1 and the directions of the die metal lines 920 of the second die 910-2. FIG. 9 further illustrates that some of the stitch metal lines 940 may be have portions that are substantially perpendicular to the die metal lines 920 as well as portions that are parallel to the die metal lines 920 (e.g., as is shown with an example stitch metal line 940 shown at the top of the stitched die 900). In other embodiments, the relative orientation of the die metal lines 920 and the stitch metal lines 940 may be different from what is shown in FIG. 9, and/or relative orientations of the die metal lines 920 within any of the dies 910 may be different from what is shown in FIG. 9. Furthermore, in some embodiments, any of the die metal lines 920 and/or the stitch metal lines 940 may have portions that are not only straight lines but have curves.

In some embodiments, the stitch metal lines 940 may be fabricated using a technique commonly known as "direct write" where a laser is used to perform lithography (as opposed to using a mask-based lithography). In other embodiments, the stitch metal lines 940 may be fabricated using a mask-based lithography. In either of those embodiments, the stitch metal lines 940 may be fabricated after the metal lines 920 of the individual dies 910 have been fabricated and after the individual dies 910 have been arranged next to one another in a single plane. In some embodiments, a support structure or an adhesive may be used to hold the individual dies 910 together during stitching.

Because the stitch metal lines 940 are provided after the die metal lines 920, in some embodiments, one or more of widths, cross-sectional shapes, and material composition of the stitch metal lines 940 and the die metal lines 920 may be different. For example, the die metal lines 920 may include a liner material, while the stitch metal lines 940 may not have any liner (e.g., if a direct write technique is used to provide them) or may have a liner of a different material composition (e.g., if a mask-based lithography is used to provide them). In another example, electrically conductive materials of the stitch metal lines 940 and the die metal lines 920 may be different. For example, the electrically conductive material of the die metal lines 920 may include copper (Cu), while the electrically conductive material of the stitch metal lines 940 may include tungsten (W), aluminum (Al), ruthenium (Ru), cobalt (Co), or AlCu (e.g., in proportions of between 1:1 to 1:100), or vice versa. In the electrically conductive materials of the stitch metal lines 940 and the die metal lines 920, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. Thus, any differences in the material composition of the electrically conductive materials of the stitch metal lines 940 and the die metal lines 920 that are beyond the unintentional doping/impurities levels of about 0.1% of a given material could be indicative of the die stitching used to form the stitched die 900. In yet another example, cross-sectional shapes of the stitch metal lines 940 and the die metal lines 920 may be different, e.g., indicative of the fabrication techniques used to form those. For example, in some embodiments, the cross-sectional shapes of both the stitch metal lines 940 and the die metal lines 920 may be substantially trapezoid, but the trapezoids of the die metal lines 920 may have their short sides at the bottom and their long sides at the top, while the trapezoids of the stitch metal lines 940 may have their long sides at the bottom and their short sides at the top. Additionally or alternatively, the heights of the trapezoids (i.e., the thicknesses) of the stitch metal lines 940 and the die metal lines 920 may be different, e.g., at least about 5% different, at least about 10% different, or at least 5-50% different. In some embodiments, the angles of the trapezoidal cross-sections of the stitch metal lines 940 and the die metal lines 920 may be different (e.g., the angles between the long sides and one of the sidewalls of the trapezoids), e.g., at least about 5% different, at least about 10% different, or at least 5-50% different. In some embodiments, areas of transverse cross-sections of the stitch metal lines 940 and the die metal lines 920 may be different, e.g., at least about 5% different, at least about 10% different, or at least 5-50% different. In some embodiments, a pitch of at least some of the stitch metal lines 940 may be different (typically, larger) from a pitch of at least some of the die metal lines 920, e.g., at least about 5% different, or at least about 10% different.

Figure 10A:
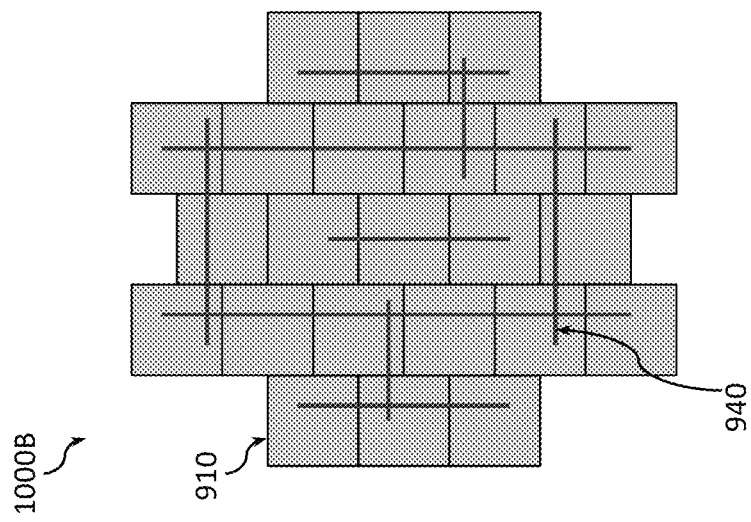

FIGS. 10A and 10B provide additional example illustrations of top-down views of stitched dies 1000A and 1000B of a microelectronic assembly, in accordance with some embodiments. For example, in some embodiments, any of the stitched dies 1000A and 100B may be the base memory die 112 or 412, as described above. In other embodiments, any of the stitched dies 1000A and 100B may be the stack memory die 122, as described above. In still other embodiments, any of the stitched dies 1000A and 100B may be the base compute die 114 or the stack compute die 124, as described above. The stitches dies 1000A and 1000B provide further examples of the stitched die 900, described above. As shown in FIG. 10, each of the stitches dies 1000A and 1000B includes a plurality of dies 910, where stitch metal lines 940 cross over various example combinations of two or more of the dies 910. In some embodiments, the stitch metal lines 940 may be provided in a symmetric manner, as is shown in the example of FIG. 10A. However, in other embodiments, the stitch metal lines 940 may be provided in an asymmetric manner, as is shown in the example of FIG. 10B. FIG. 10B further illustrates that, in some embodiments of die stitching, the dies 910 may be provided in a single plane but staggered or offset with respect to one another.

Although not specifically illustrated in FIGS. 9 and 10, in some embodiments, the stitch metal lines 940 may also be used to provide electrical connectivity between various die metal lines 920 of a single die 910.

One feature that may be indicative of stitching performed to interconnect multiple coplanar dies 910 is that the stitch metal lines 940 may trespass one or more scribe streets 930. One feature that may be indicative of stitching performed to interconnect multiple coplanar dies 910 or to provide additional electrical connectivity between various die metal lines 920 of a single die 910 is that the stitch metal lines 940 may be slightly misaligned with respect to the die metal lines 920 that they are intended to couple to. For example, misalignment may be such that the end of the stitch metal line 940 may extend beyond the sidewall of the die metal line 920 that the stitch metal line 940 is supposed to couple to. In another example, misalignment may be such that the end of the stitch metal line 940 does not reach the sidewall of the die metal line 920 that the stitch metal line 940 is supposed to couple to. In some embodiments, such misalignments may be between about 0.2 and 5 nanometers, including all values and ranges therein, e.g., between about 0.2 and 3 nanometers, or between about 0.5 and 3 nanometers.

Using a Glass Carrier

FIGS. 11A-11F provide schematic illustrations of cross-sectional side view of a microelectronic assembly with a glass carrier at different instances of a fabrication process, in accordance with some embodiments.

A microelectronic assembly 1100A, shown in FIG. 11A, illustrates that fabrication of a microelectronic assembly may begin with providing a die 1102, a plurality of vias 1104, and a plurality of interconnects 1106. Although not specifically shown in FIG. 11, the die 1102 may include a plurality of IC components and circuits, such as any of the memory and/or logic circuits as described herein. For example, in some embodiments, the die 1102 may be the base memory die 112 or 412, as described above. In other embodiments, the die 1102 may be the stack memory die 122, as described above. In still other embodiments, the die 1102 may be any of the base compute die 114, the stack compute die 124, or the additional stack compute die 126, as described above. At least some of the plurality of vias 1104 may be the signal vias 302 and/or the power vias 402, as described above. Although not specifically shown in FIG. 11, the die 1102 may include additional interconnects (i.e., vias and/or lines) for providing electrical connectivity to various IC components of the die 1102. The interconnects 1106 may be either DTD or DTPS interconnects, as described above.

A microelectronic assembly 1100B, shown in FIG. 11B, illustrates that fabrication of the microelectronic assembly may proceed with bonding a glass carrier structure (or, simply, a glass carrier) 1108 to the side of the die 1102 with the interconnects 1106, where the glass carrier 1108 may include any suitable glass-based support structure, such as quartz glass. In some embodiments, the glass carrier 1108 and the die 1102 may be bonded using insulator-insulator bonding, e.g., oxide-oxide bonding, where an insulating material of, or provided over, the die 1102 is bonded to an insulating material of the glass carrier 1108. In some embodiments, a bonding material 1110 may be present in between the faces of the die 1102 and the glass carrier 1108 that are bonded together. To that end, the bonding material 1110 may be applied to the one or both faces of the die 1102 and the glass carrier 1108 and then the die 1102 and the glass carrier 1108 are put together, possibly while applying a suitable pressure and heating up the assembly to a suitable temperature (e.g., to moderately high temperatures, e.g., between about 50 and 200 degrees Celsius) for a duration of time. In some embodiments, the bonding material 1110 may be an adhesive material that ensures attachment of the die 1102 and the glass carrier 1108 to one another. In some embodiments, the bonding material 1110 may be an etch-stop material. In some embodiments, the bonding material 1110 may be both an etch-stop material and have suitable adhesive properties to ensure attachment of the first and second IC structures to one another. In general, the bonding material 1110 may include any of the bonding materials described above with reference to bonding of the faces of the first and second IC structures. For example, in some embodiments, the bonding material 1110 may include silicon, nitrogen, and carbon, e.g., SiOCN, where the atomic percentage of any of these materials may be at least 1%, e.g., between about 1% and 50%, indicating that these elements are added deliberately, as opposed to being accidental impurities.

Figure 11C:
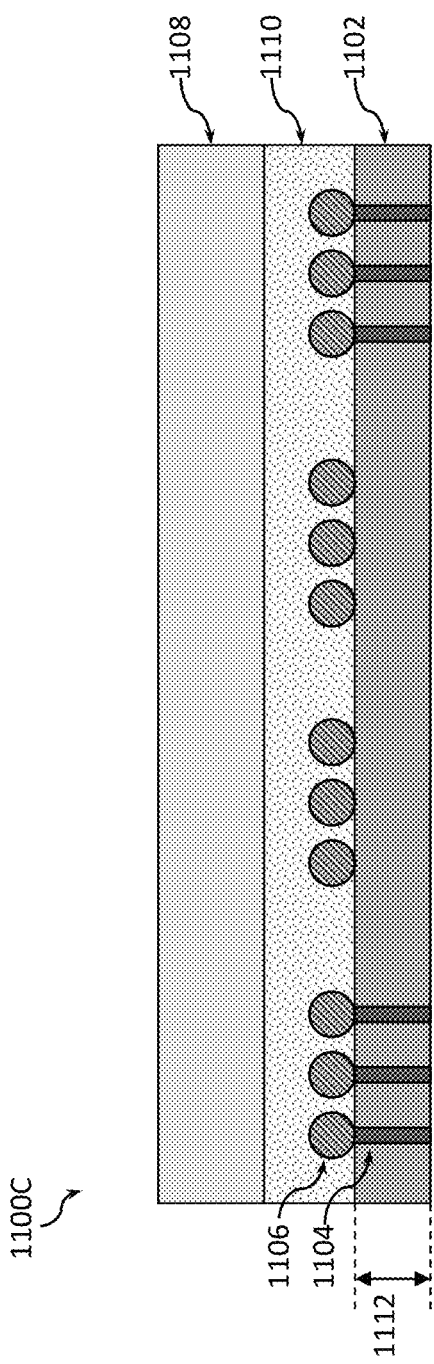
Figure 11D:
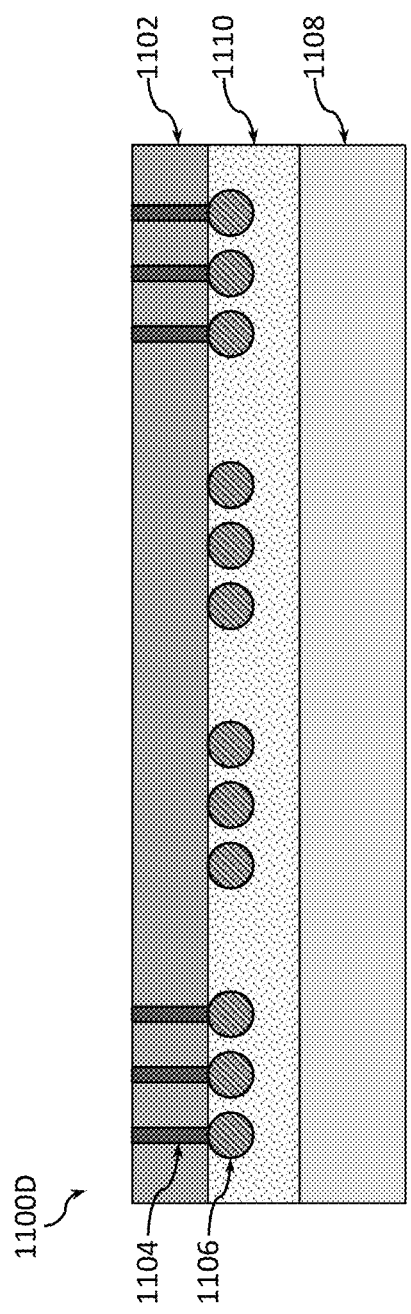

A microelectronic assembly 1100C, shown in FIG. 11C, illustrates that fabrication of the microelectronic assembly may proceed with grinding the backside of the die 1102 to reveal the vias 1104 so that electrical connections can later be made to the vias 1104 from the backside of the die 1102. Grinding of the backside of the die 1102 to reveal the vias 1104 may be performed using any suitable thinning/polishing processes as known in the art. At this point, the glass carrier 1108 may provide the mechanical stability to the microelectronic assembly. In some embodiments, after the vias 1104 have been revealed at the backside, the die 1102 may have a thickness 1112, which may be between about 5 and 14 micron, including all values and ranges therein, e.g., between about 8 and 12 micron, e.g., around 10 micron.

The fabrication may then proceed with flipping the microelectronic assembly 1100C upside down so that the side with the exposed vias 1104 may be processed next. A result of such a flip is illustrated as a microelectronic assembly 1100D, shown in FIG. 11D.

Figure 11E:
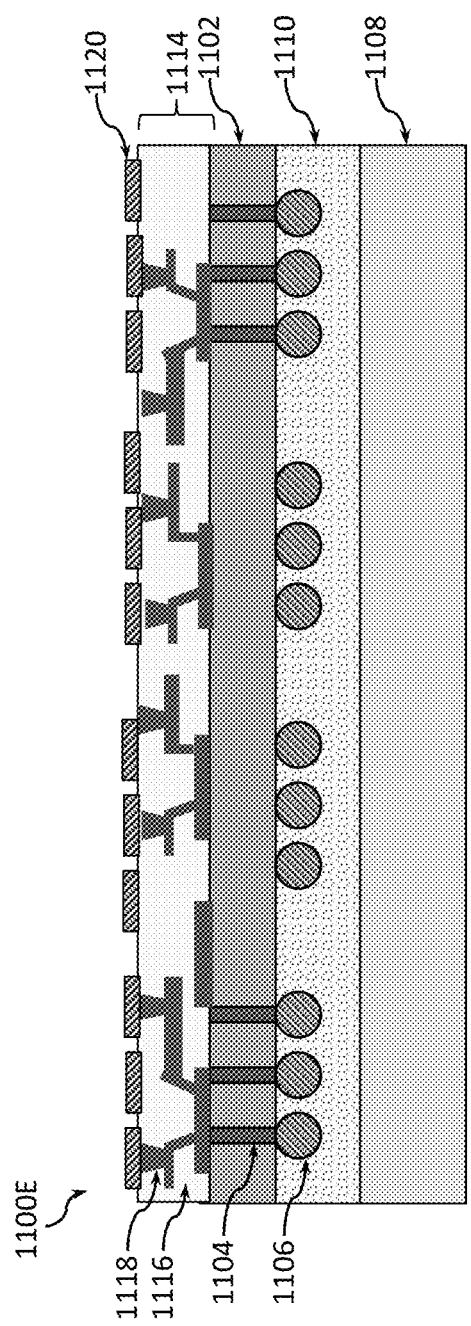

A microelectronic assembly 1100E, shown in FIG. 11E, illustrates that fabrication of the microelectronic assembly may then proceed with providing a redistribution layer (RDL) 1114 that includes an isolating material 1116, and a plurality of interconnects 1118. The plurality of interconnects 1118 may include conductive vias and conductive lines in any suitable arrangement for providing electrical connectivity between the electrically conductive structures of the die 1102 (e.g., the vias 1104) on one side of the RDL 1114 and conductive contacts 1120 on the other side of the RDL 1114.

The isolating material 1116 may include any suitable material for providing electrical isolation between various ones of the interconnects 1118, as required by the design. In various embodiments, the isolating material 1116 may be a low-k or high-k dielectric including, but not limited to, elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the isolating material 1116 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, the isolating material 1116 may include materials commonly used as dielectric spacers, e.g., low-k dielectric materials, such as, but are not limited to, silicon dioxide, carbon-doped oxide, silicon nitride, FSG, and organosilicates such as silsesquioxane, siloxane, and organosilicate glass. Other examples of low-k dielectric materials that may be used as the isolating material 1116 include organic polymers such as polyimide, polynorbornenes, benzocyclobutene, perfluorocyclobutane, or polytetrafluoroethylene (PTFE). Still other examples of low-k dielectric materials that may be used as the isolating material 1116 include silicon-based polymeric dielectrics such as hydrogen silsesquioxane (HSQ) and methylsilsesquioxane (MSQ).

In some embodiments, various electrically conductive materials described herein, e.g., the one or more electrically conductive materials of the interconnects 1118, may include one or more metals or metal alloys with metals such as copper, ruthenium, palladium, platinum, cobalt, nickel, hafnium, zirconium, titanium, tantalum, molybdenum, and aluminum. In some embodiments, the electrically conductive materials described herein, e.g., the one or more electrically conductive materials of the interconnects 1118, may include one or more electrically conductive alloys, oxides (e.g., conductive metal oxides), carbides (e.g., hafnium carbide, zirconium carbide, titanium carbide, tantalum carbide, and aluminum carbide), or nitrides (e.g. hafnium nitride, zirconium nitride, titanium nitride, tantalum nitride, and aluminum nitride) of one or more metals.

The conductive contacts 1120 may be implemented as, e.g., pads or posts, e.g., copper pads or posts, to assist routing power, ground, and signals from the die 1102 to further dies to be attached to the microelectronic assembly 1100E in a later fabrication process.

Figure 11F:
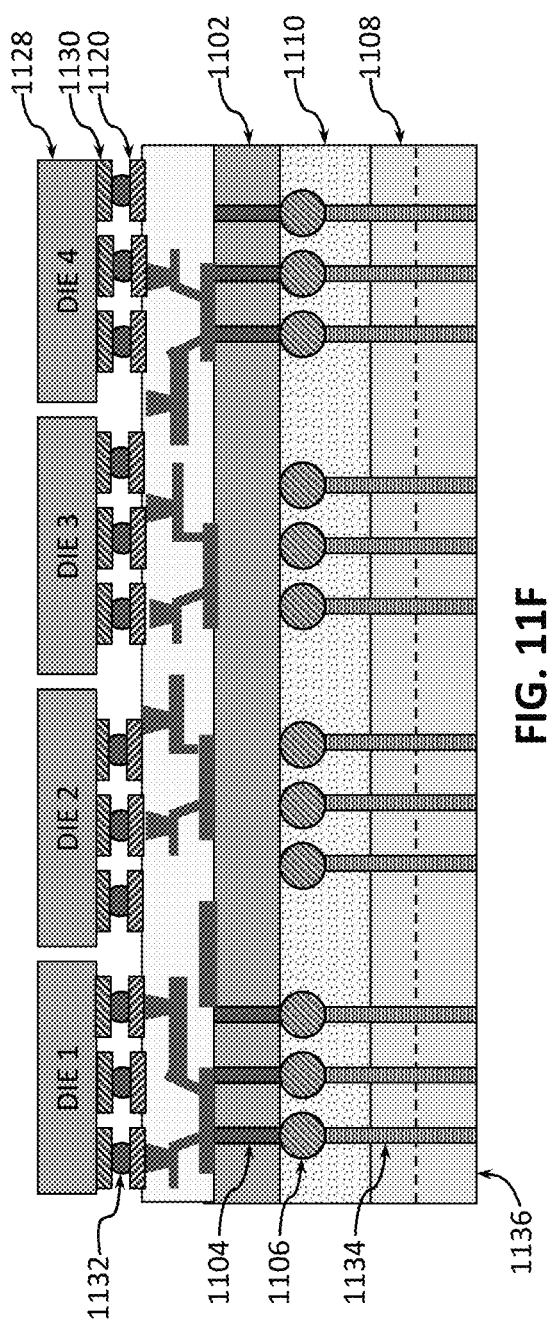

A microelectronic assembly 1100F, shown in FIG. 11F, illustrates that fabrication of the microelectronic assembly may then proceed with providing one or more dies 1128, each die 1128 including conductive contacts 1130. The conductive contacts 1130 may be similar to the conductive contacts 1120, i.e., may include pads or posts, e.g., copper pads or posts, to assist routing power, ground, and signals between the die 1128 and the die 1102 of the microelectronic assembly 1100F.

FIG. 11F further illustrates interconnects 1132 that couple the conductive contacts 1120 and the conductive contacts 1130. The interconnects 1132 may be DTD interconnects as described above. FIG. 11F also illustrates interconnects 1134, configured to provide electrical connectivity from the backside 1136 of the glass carrier 1108 to the interconnects 1106. As shown in FIG. 11F, the interconnects 1134 may extend through the bonding material 1100 and the glass carrier 1108, and may be coupled to the interconnects 1106 and, therefore, the vias 1104. In some embodiments, the interconnects 1134 may be implemented as a plurality of vias and may include vias similar to the signal vias 302 and/or the power vias 402, as described above.

Still further, FIG. 11F illustrates a horizontal dashed line within the glass carrier 1108, indicating that, in some embodiments, the glass carrier 1108 may be thinned as well, e.g., using a thinning/polishing process similar to that used to grind the backside of the die 1102 to reveal the vias 1104.

The dies 1128 may include IC devices and circuits that provide functionality that may be complementary or additional to that of the die 1102. Thus, FIGS. 11A-11F illustrate how different dies may be stacked over one another in presence of the glass carrier 1108. The glass carrier 1108 may advantageously reduce parasitic effects associated with the stacked dies, e.g., because the glass carrier 1108 allows reducing thickness of the stacked dies. For example, in some embodiments, the thickness of the die 1102 may advantageously be smaller than the thickness of the glass carrier 1108. In some embodiments, the microelectronic assembly 1100F, or parts thereof, may be a part of the microelectronic assembly 100, shown in FIG. 1. For example, as will now be explained, the die 1102 may be any of the dies 112 or 114, and the dies 1128 may be dies of the stacks 120.

In some embodiments, the microelectronic assembly 1100F may be implemented in the microelectronic assembly 100 so that the glass carrier 1108 is provided either at the top of a stack of dies of the base structure 110 or at the bottom of a stack of dies of the base structure 110. One example of the former (i.e., the glass carrier 1108 is provided at the top of a stack of dies of the base structure 110) is an embodiment where the die 1102 is the base compute die 114 and the die 1128 is one of the base memory dies 112. Another example of the former is an embodiment where the die 1102 is the top one of the base memory dies 112 (i.e., the one coupled to the base compute die 114) and the die 1128 is the next one of the base memory dies 112. One example of the latter (i.e., the glass carrier 1108 is provided at the bottom of a stack of dies of the base structure 110) is an embodiment where the die 1102 is the bottom one of the base memory dies 112 and the die 1128 is the base compute die 114 if the die stack of the base structure 110 includes only one base memory die 112. Another example of the latter is an embodiment where the die 1102 is the bottom one of the base memory dies 112 and the die 1128 is the next base memory die 112 (i.e., the one second from the bottom).

In some embodiments, the microelectronic assembly 1100F may be implemented in the microelectronic assembly 100 so that the glass carrier 1108 is provided either at the top of a stack of dies of one of the stacks 120 or at the bottom of a stack of dies of one of the stacks 120. One example of the former (i.e., the glass carrier 1108 is provided at the top of a stack of dies of one of the stacks 120) is an embodiment where the die 1102 is the stack compute die 124 and the die 1128 is one of the stack memory dies 122. Another example of the former is an embodiment where the die 1102 is the top one of the stack memory dies 122 (i.e., the one coupled to the stack compute die 124) and the die 1128 is the next one of the stack memory dies 122. One example of the latter (i.e., the glass carrier 1108 is provided at the bottom of a stack of dies of one of the stacks 120) is an embodiment where the die 1102 is the bottom one of the stack memory dies 122 and the die 1128 is one of the next stack memory die 122, the additional stack compute die 126, or the stack compute die 124. Another example of the latter is an embodiment where the die 1102 is the bottom one of the stack memory dies 122 and the die 1128 is the next stack memory die 122 (i.e., the one second from the bottom).

Example IC Packages

Figure 12A:
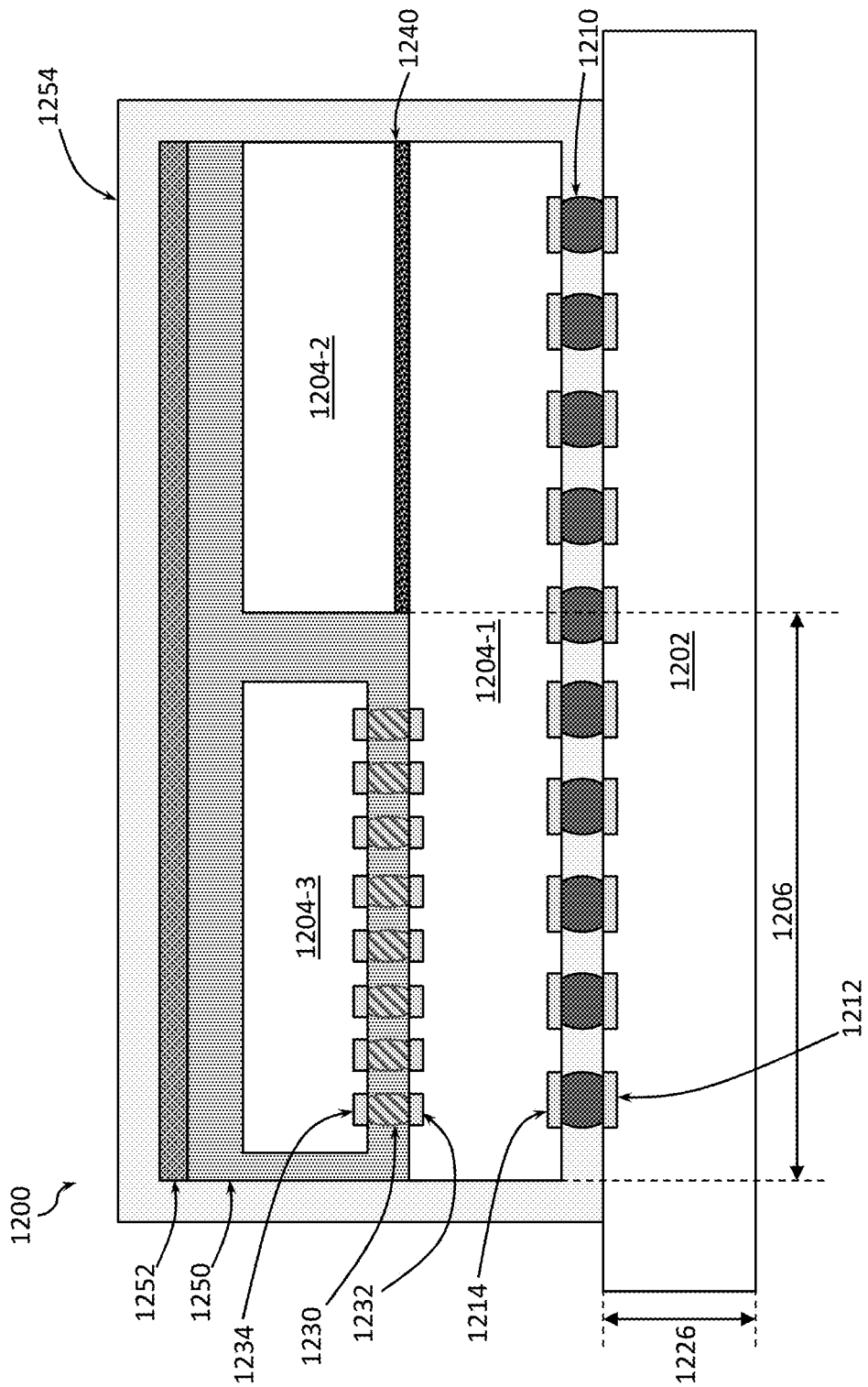
FIGS. 12A and 12B illustrate examples of an IC package that may include one or more dies and/or microelectronic assemblies as described herein, in accordance with some embodiments.
Figure 12B:
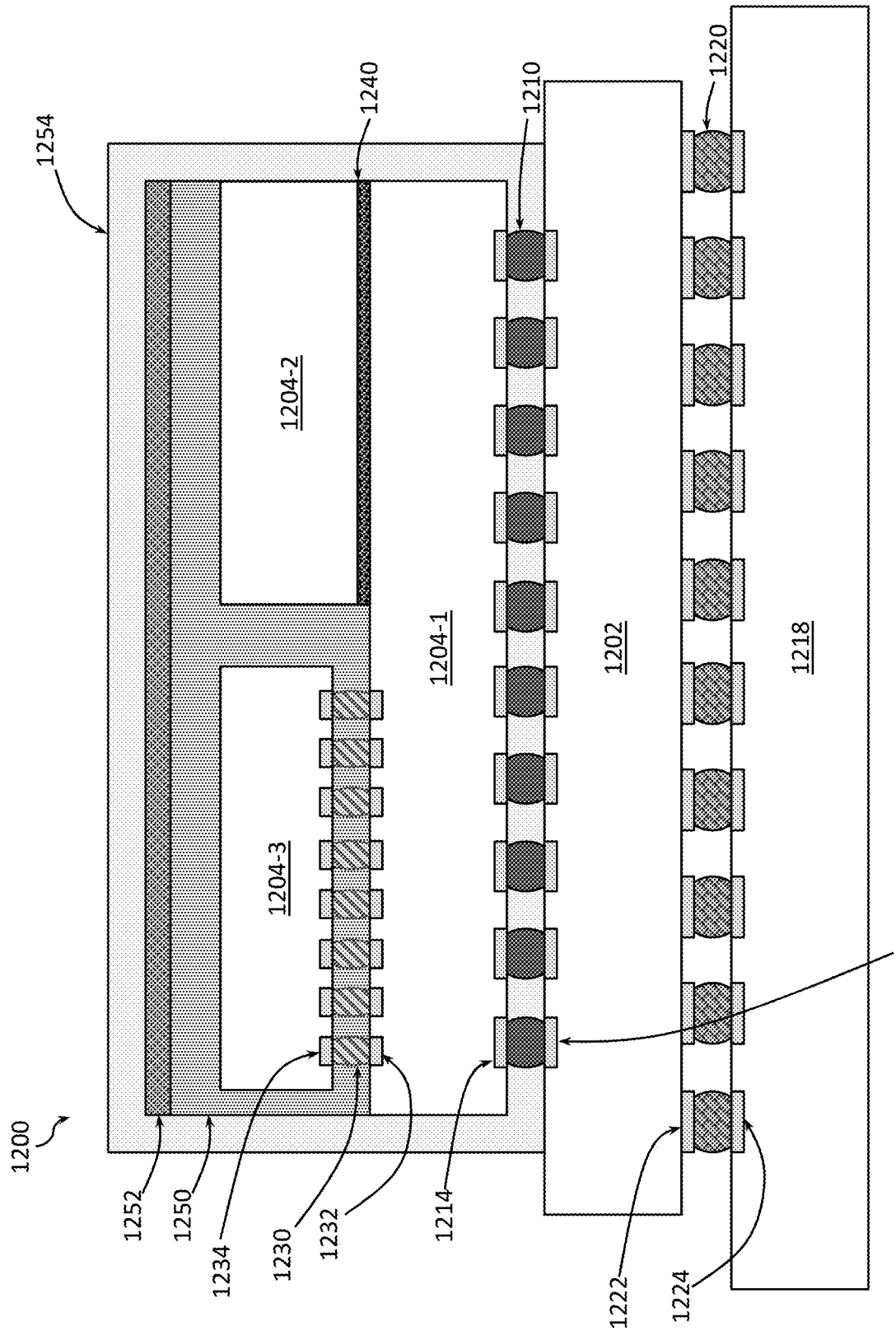

FIGS. 12A and 12B illustrate examples of an IC package 1200 that may include one or more dies and/or microelectronic assemblies as described herein, in accordance with some embodiments.

As shown in FIG. 12A, the IC package 1200 may include a package substrate 1202 and one or more dies 1204 (with the example embodiment shown illustrating three dies 1204, labeled as dies 1204-1 through 1204-3).

The package substrate 1202 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 1202 may be a dielectric material, such as an organic dielectric material, a fire retardant grade 4 material (FR-4), bismaleimide triazine (BT) resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). In particular, when the package substrate 1202 is formed using standard PCB processes, the package substrate 1202 may include FR-4, and the conductive pathways in the package substrate 1202 may be formed by patterned sheets of copper separated by build-up layers of the FR-4. The conductive pathways in the package substrate 1202 may be bordered by liner materials, such as adhesion liners and/or barrier liners, as suitable.

In some embodiments, the package substrate 1202 may be a lower density medium and any of the dies 1204 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

In general, in various embodiments of the IC package 1200, the different dies 1204 may include any suitable circuitry. For example, in some embodiments, the die 1204-1 may be an active or passive die, and the die 1204-2 may include one or more of I/O circuitry, high-bandwidth memory, eDRAM, etc. For example, in some embodiments, the die 1204-1 may include a power delivery circuitry and the die 1204-2 may include a memory device, e.g., a high-bandwidth memory device, or, in other embodiments, the die 1204-1 may include I/O circuitry and the die 1204-2 may include a field programmable gate array logic. In some embodiments, any of the dies 1204 may include one or more device layers including transistors (e.g., transistors as discussed above with reference to FIG. 6 and/or transistors as discussed below with reference to FIG. 14).

In various embodiments, any of the dies 1204 may be any of the dies of the microelectronic assemblies described with reference to FIGS. 1-11.

For example, in some embodiments, any of the dies 1204 may be a memory die as described herein, e.g., the base memory die 112 or 412 or the stack memory die 122, described above. In some such embodiments, the die 1204 that is a memory die may be implemented as the memory die 500 or the memory die 800, describe as above. In other some embodiments, any of the dies 1204 may be a compute die as described herein, e.g., the base compute die 114, the stack compute die 124, or the additional stack compute die 126, described above. In some further embodiments, at least one of the dies 1204 may be a memory die as described herein and at least one other one of the dies 1204 may be a compute die as described herein.

In some embodiments, any of the dies 1204 may be a stack of dies. For example, any of the dies 1204 may be the base structure 110 or 710, the stack 120 or 720, the die 300, or the base memory structure 400.

In some embodiments, any of the dies 1204 may be a stitched die, e.g., the stitched die 900, the stitched die 1000A or the stitched die 1000B, as described above.

In some embodiments, any of the dies 1204 may be a die bonded to a glass carrier, e.g., any of the dies 1204 may be the die 1102, bonded to the glass carrier 1108, as described above.

In some embodiments, one of the dies 1204-1 and 1204-2 may have a smaller footprint than the other, e.g., shown in the example of FIG. 12A with the die 1204-2 being narrower than the die 1204-1. For example, in some embodiments, a width of the die 1204-1 may be larger than a width of the die 1204-2 by a distance 1206. In some embodiments, the distance 1206 may be between about 0.5 millimeters and 5 millimeters (e.g., between about 0.75 millimeters and 12 millimeters, or approximately 1 millimeter). Although the die 1204-2 is shown to be aligned with the die 1204-1 on the right side, there does not have to be such alignment in various embodiments of the IC packages 1200 and in various embodiments of the microelectronic assemblies as described herein.

As shown in FIG. 12A, the package substrate 1202 may be coupled to the die 1204-1 by DTPS interconnects 1210. In particular, the top surface of the package substrate 1202 may include a set of conductive contacts 1212, and the bottom surface of the die 1204-1 may include a set of conductive contacts 1214. The conductive contacts 1214 at the bottom surface of the die 1204-1 may be electrically and mechanically coupled to the conductive contacts 1212 at the top surface of the package substrate 1202 by the DTPS interconnects 1210. The conductive contacts 1214, as well as any of the conductive contacts described above, may include bond pads, posts, or any other suitable conductive contacts, for example.

FIG. 12B illustrates that, in some embodiments, the IC package 1200 may also include a circuit board 1218. The package substrate 1202 may be coupled to the circuit board 1218 by second-level interconnects 1220 at the bottom surface of the package substrate 1202. In particular, the package substrate 1202 may include conductive contacts 1222 at its bottom surface, and the circuit board 1218 may include conductive contacts 1224 at its top surface. The second-level interconnects 1220 may electrically and mechanically couple the conductive contacts 1224 and the conductive contacts 1222. The second-level interconnects 1220 illustrated in FIG. 12B are shown to represent solder balls (e.g., for a ball grid array arrangement), but any suitable second-level interconnects 1220 may be used (e.g., pins in a pin grid array arrangement or lands in a land grid array arrangement) in other embodiments of the IC package 1200. The circuit board 1218 may be a motherboard, for example, and may have other components attached to it (not shown). The circuit board 1218 may include conductive pathways and other conductive contacts (not shown) for routing power, ground, and signals through the circuit board 1218, as known in the art. In some embodiments, the second-level interconnects 1220 may not couple the package substrate 1202 to a circuit board 1218 but may instead couple the package substrate 1202 to another IC package, an interposer, or any other suitable component.

In some embodiments, one or more of the conductive pathways in the package substrate 1202 may extend between one or more conductive contacts 1212 at the top surface of the package substrate 1202 and one or more conductive contacts 1222 at the bottom surface of the package substrate 1202. In some embodiments, one or more of the conductive pathways in the package substrate 1202 may extend between different conductive contacts 1212 at the top surface of the package substrate 1202. In some embodiments, one or more of the conductive pathways in the package substrate 1202 may extend between different conductive contacts 1222 at the bottom surface of the package substrate 1202. The rest of the descriptions provided with respect to FIG. 12A are applicable to, and may be combined with, the embodiment of FIG. 12B (and vice versa), and, therefore, in the interests of brevity, are not repeated.

In some embodiments, the die 1204-1 of the IC package 1200 as described herein may be a double-sided (or "multi-level," or "omni-directional") die in the sense that the die 1204-1 has conductive contacts 1214 on one surface and further conductive contacts 1232 on the opposing surface, as is shown in FIG. 12A. In other embodiments, the die 1204-1 of the IC package 1200 as described herein may be a single-sided die in the sense that the die 1204-1 only has conductive contacts 1214 on a single surface and no contacts 1232 on the opposing surface, not shown in FIG. 12.

In some embodiments, the IC package 1200 may include at least two dies 1204 that are coupled by DTD interconnects. This is illustrated in FIG. 12A with the die 1204-1 being coupled to the die 1204-3 by DTD interconnects 1230. In particular, the top surface of the die 1204-1 may include a set of conductive contacts 1232, and the bottom surface of the die 1204-3 may include a set of conductive contacts 1234. One or more of the conductive contacts 1234 at the bottom surface of the die 1204-3 may be electrically and mechanically coupled to some of the conductive contacts 1232 at the top surface of the die 1204-1 by the DTD interconnects 1230. FIG. 12A illustrates that the pitch of the DTD interconnects 1230 may be different from the pitch of the DTPS interconnects 1210 in some embodiments (in other embodiments, these pitches may be substantially the same). In some embodiments, the die 1204-3 of the IC package 1200 may be a single-sided die (in the sense that the die 1204-3 only has conductive contacts 1234 on a single surface), as shown in FIG. 12A. In other embodiments (not specifically shown), the die 1204-3 of the IC package 1200 as described herein may be a double-sided die (in the sense that the die 1204-3 has conductive contacts 1234 on one surface and further conductive contacts on the opposing surface, the latter configured to couple the die 1204-3 to further components). Although not specifically shown in FIG. 12A, in some embodiments, the die 1204-3 may be electrically and mechanically coupled to the package substrate 1202 by DTPS interconnects similar to how the die 1204-1 is coupled to the package substrate 1202 by the DTPS interconnects 1210.

The DTPS interconnects 1210 and the DTD interconnects 1230 may be implemented as described above, e.g., as described with reference to FIG. 1.

In some embodiments, the IC package 1200 may include at least two dies 1204 that are hybrid bonded. This is illustrated in FIG. 12A with the die 1204-1 being hybrid bonded to the die 1204-2 with a bonding material 1240 therebetween. In some embodiments, the bonding material 1240 may be a material as described with reference to FIG. 4 regarding bonding of the faces of the first and second IC structures (e.g., bonding of the faces of the dies 1204-1 and 1204-2, shown in FIG. 12A). In other embodiments, no bonding material may be used, but there will still be a bonding interface resulting from the bonding of the first and second IC structures (e.g., bonding of the faces of the dies 1204-1 and 1204-2, shown in FIG. 12A) to one another, as also described with reference to FIG. 4. Thus, in such embodiments, the bonding material 1240 shown in FIG. 12A refers to a bonding interface.

FIG. 12A further illustrates that, in some embodiments, the IC package 1200 may include one or more of a mold material 1250, a thermal interface material (TIM) 1252, and a heat spreader 1254 (i.e., in other embodiments of the IC package 1200, one or more of the mold material 1250, the TIM 1252, and the heat spreader 1254 may be absent).

The mold material 1250 may extend around one or more of the dies 1204 over the package substrate 1202. In some embodiments, the mold material 1250 may extend above one or more of the dies 1204 on the package substrate 1202. In some embodiments, the mold material 1250 may extend between one or more of the dies 1204 and the package substrate 1202 around the associated DTPS interconnects 1210. In such embodiments, the mold material 1250 may serve as an underfill material. In some embodiments, the mold material 1250 may extend between different ones of the dies 1204 around the associated DTD interconnects 1230. In such embodiments, the mold material 1250 may serve as an underfill material. The mold material 1250 may include multiple different mold materials (e.g., an underfill material, and a different overmold material). The mold material 1250 may be an insulating material, such as an appropriate epoxy material. In some embodiments, the mold material 1250 may include an underfill material that is an epoxy flux that assists with soldering the die 1204-1 to the package substrate 1202 when forming the DTPS interconnects 1210, and then polymerizes and encapsulates the DTPS interconnects 1210. The mold material 1250 may be selected to have a coefficient of thermal expansion (CTE) that may mitigate or minimize the stress between the dies 1204 and the package substrate 1202 arising from uneven thermal expansion in the IC package 1200. In some embodiments, the CTE of the mold material 1250 may have a value that is intermediate to the CTE of the package substrate 1202 (e.g., the CTE of the dielectric material of the package substrate 1202) and a CTE of the dies 1204.

The TIM 1252 may include a thermally conductive material (e.g., metal particles) in a polymer or other binder. The TIM 1252 may be a thermal interface material paste or a thermally conductive epoxy (which may be a fluid when applied and may harden upon curing, as known in the art). The TIM 1252 may provide a path for heat generated by the dies 1204 to readily flow to the heat spreader 1254, where it may be spread and/or dissipated. Some embodiments of the IC package 1200 of FIG. 12A may include a sputtered backside metallization (not shown) across the mold material 1250 and the dies 1204. In such embodiments, the TIM 1252 (e.g., a solder TIM) may be disposed on this backside metallization.

The heat spreader 1254 may be used to move heat away from the dies 1204 (e.g., so that the heat may be more readily dissipated by a heat sink or other thermal management device). The heat spreader 1254 may include any suitable thermally conductive material (e.g., metal, appropriate ceramics, etc.), and may include any suitable features (e.g., fins). In some embodiments, the heat spreader 1254 may be an integrated heat spreader.

In some embodiments of FIG. 12A, the die 1204-1 may provide high density interconnect routing in a localized area of the IC package 1200. In some embodiments, the presence of the die 1204-1 may support direct chip attach of fine-pitch semiconductor dies (e.g., the dies 1204-2 and 1204-3) that cannot be attached entirely directly to the package substrate 1202. In particular, as discussed above, the die 1204-1 may support trace widths and spacings that are not achievable in the package substrate 1202. The proliferation of wearable and mobile electronics, as well as Internet of Things (IoT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the IC packages 1200 disclosed herein may be capable of supporting chips with high density interconnects and chips with low-density interconnects without sacrificing performance or manufacturability.

In various embodiments of FIG. 12A, any of the dies 1204 may be a single-sided, single-pitch die; in other embodiments, any of the dies 1204 may be a double-sided die, and additional components may be disposed on the top surface of any of the dies 1204. Additional passive components, such as surface-mount resistors, capacitors, and/or inductors, may be disposed on the top surface or the bottom surface of the package substrate 1202, or embedded in the package substrate 1202. More generally, any suitable number of the dies 1204 in an IC package 1200 may be double-sided dies 1204.

The elements of the IC package 1200 may have any suitable dimensions. Only a subset of the accompanying figures are labeled with reference numerals representing dimensions, but this is simply for clarity of illustration, and any of the IC packages 1200 disclosed herein may have components having the dimensions discussed herein. For example, in some embodiments, a thickness 1226 (labeled in FIG. 12A) of the package substrate 1202 may be between about 0.1 millimeters and 1.4 millimeters (e.g., between about 0.1 millimeters and 0.35 millimeters, between about 0.25 millimeters and 0.8 millimeters, or approximately 1 millimeter).

Example Devices

The dies and microelectronic assemblies disclosed herein, as well as IC packages and IC assemblies that include such dies and microelectronic assemblies, may be included in any suitable electronic device. FIGS. 13-16 illustrate various examples of apparatuses that may include one or more of the dies, microelectronic assemblies, and IC packages disclosed herein.

Figures 13A, 13B:
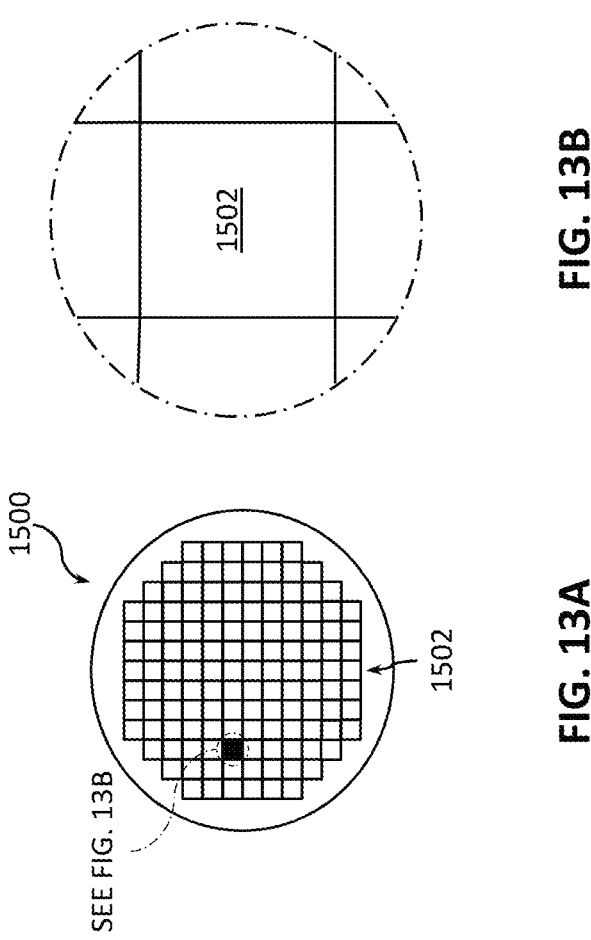
FIGS. 13A and 13B are top views of, respectively, a wafer and dies that may be used to implement one or more dies and/or microelectronic assemblies as described herein, in accordance with various embodiments.
Figure 14:
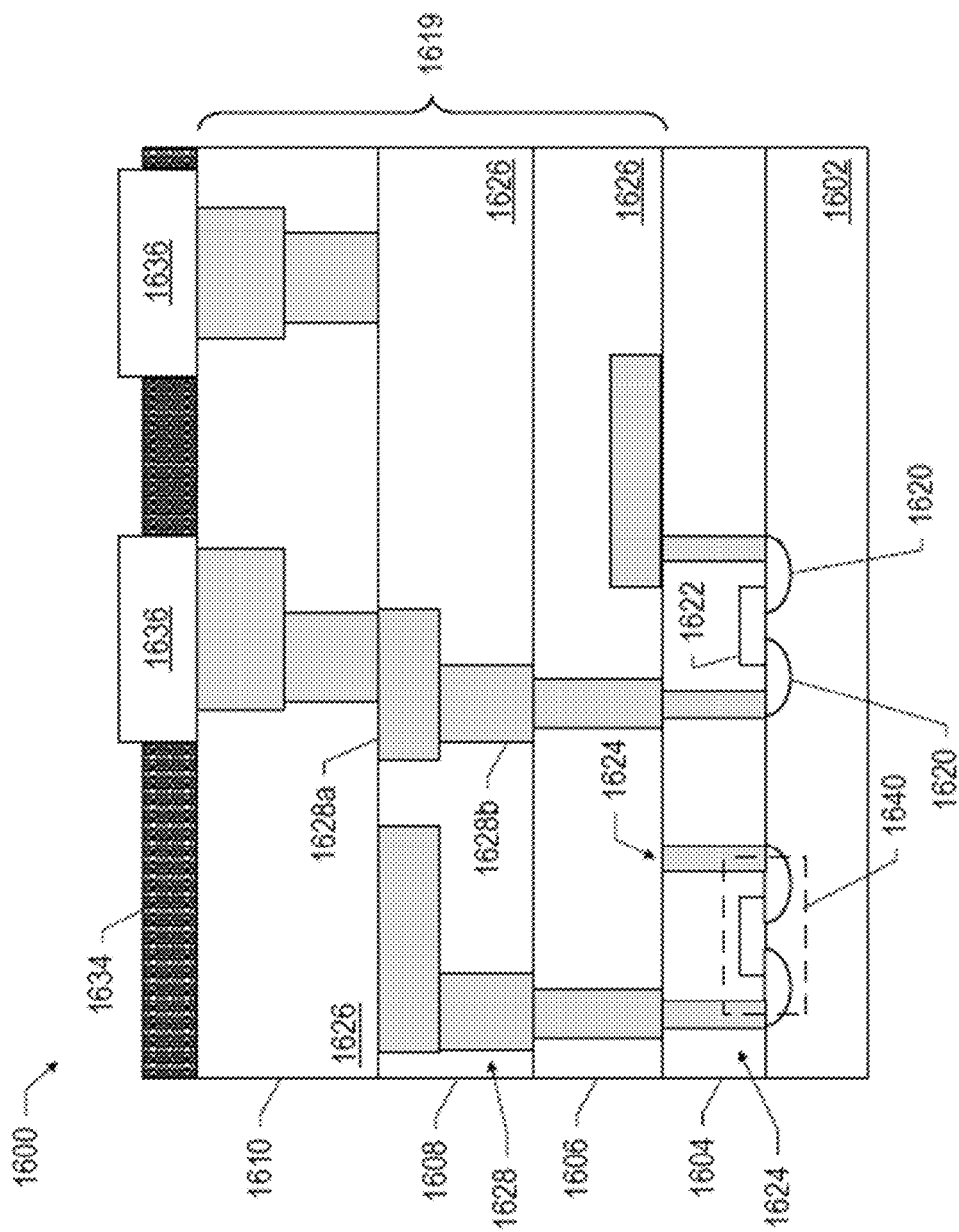
FIG. 14 is a cross-sectional side view of an IC device that may be included in one or more dies and/or microelectronic assemblies in accordance with any of the embodiments disclosed herein.

FIGS. 13A and 13B are top views of, respectively, a wafer 1500 and dies 1502 that may be included in one or more of the microelectronic assemblies in accordance with any of the embodiments disclosed herein. In some embodiments, the dies 1502 may be included in an IC package (e.g., the IC package 1200 as shown in FIG. 12) and/or in an IC device (e.g., the IC device 1600 as shown in FIG. 14), in accordance with any of the embodiments disclosed herein. For example, any of the dies 1502 may serve as the die 1204 shown in FIG. 12 and/or any of the dies 1502 may serve as the IC device 1600 shown in FIG. 14. The wafer 1500 may be composed of semiconductor material and may include one or more dies 1502 having IC structures formed on a surface of the wafer 1500. Each of the dies 1502 may be a repeating unit of a semiconductor product that includes any suitable IC as described herein. After the fabrication of the semiconductor product is complete (e.g., after manufacture of one or more of the ICs to be included in microelectronic assemblies as described herein), the wafer 1500 may undergo a singulation process in which each of the dies 1502 is separated from one another to provide discrete "chips" of the semiconductor product. In particular, devices that include one or more IC structures to be included in microelectronic assemblies as described herein may take the form of the wafer 1500 (e.g., not singulated) or the form of the die 1502 (e.g., singulated). The die 1502 may include one or more transistors (e.g., one or more of the transistors as described with reference to FIG. 6 and/or one or more of the transistors 1640 of FIG. 14, discussed below), supporting circuitry to route electrical signals to the transistors, passive components (e.g., signal traces, resistors, capacitors, or inductors), and/or any other IC components. The die 1502 may include supporting circuitry to route electrical signals to various memory cells, transistors, capacitors, as well as any other IC components. In some embodiments, the wafer 1500 or the die 1502 may implement or include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

FIG. 14 is a cross-sectional side view of an IC device 1600 that may be included in any of the dies and/or microelectronic assemblies disclosed herein. One or more of the IC devices 1600 may be included in one or more dies 1502 (FIG. 13). One or more of the IC devices 1600 may be included in one or more of the dies, microelectronic assemblies, and IC packages as described herein, e.g., as described with reference to FIGS. 1-12.

As shown in FIG. 14, the IC device 1600 may be formed on a die substrate 1602 (e.g., the wafer 1500 of FIG. 13) and may be included in a die (e.g., the die 1502 of FIG. 13). The die substrate 1602 may be a semiconductor substrate composed of semiconductor material systems including, for example, N-type or P-type materials systems (or a combination of both). The die substrate 1602 may include, for example, a crystalline substrate formed using a bulk SOI substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 13) or a wafer (e.g., the wafer 1500 of FIG. 13).

The IC device 1600 may include one or more device layers 1604 disposed on the die substrate 1602. The device layer 1604 may include features of one or more transistors 1640 (e.g., metal oxide semiconductor FETs (MOSFETs)) formed on the die substrate 1602. The device layer 1604 may include, for example, one or more S/D regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric of the gate 1622 may be implemented as described above with reference to the gate dielectric 622. The gate electrode of the gate 1622 may be implemented as described above with reference to the gate electrode 620.

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, as described above with reference to the S/D regions 604, 614.

Electrical signals, such as power and/or I/O signals, may be routed to and/or from the devices (e.g., transistors 1640) of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 14. Although a particular number of interconnect layers 1606-1610 is depicted in FIG. 14, embodiments of the present disclosure include IC devices having more or fewer interconnect layers than depicted.

In some embodiments, the interconnect structures 1628 may include lines (or traces) 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 14. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 14. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 14, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts described above, as appropriate.

In some embodiments in which the IC device 1600 is a double-sided die (e.g., similar to the example of the die 1204-1, shown in FIG. 12), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts described above, as appropriate.

In other embodiments in which the IC device 1600 is a double-sided die (e.g., similar to the example of the die 1204-1, shown in FIG. 12), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636. These additional conductive contacts may serve as the conductive contacts described above, as appropriate.

Figure 15:
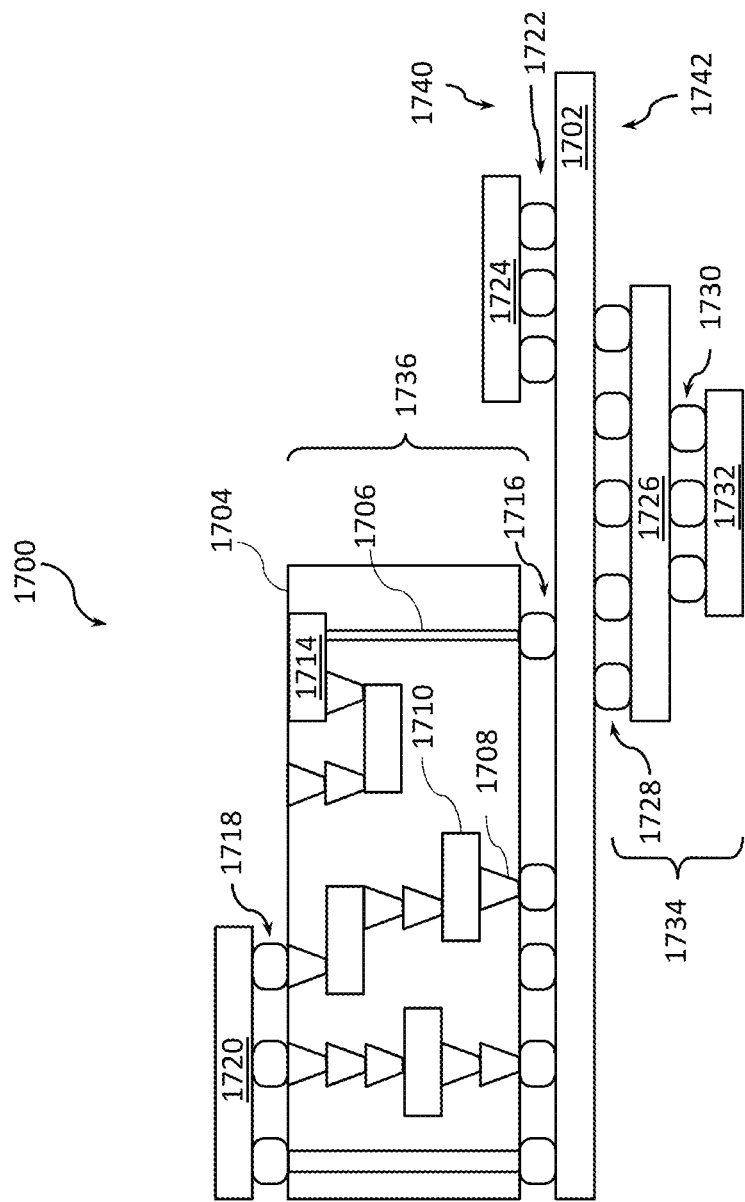
FIG. 15 is a cross-sectional side view of an IC device assembly that may include one or more dies and/or microelectronic assemblies in accordance with various embodiments.

FIG. 15 is a cross-sectional side view of an IC device assembly 1700 that may include components having one or more dies and/or microelectronic assemblies in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of one or more dies and/or microelectronic assemblies in accordance with any of the embodiments disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (e.g., as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. The IC package 1720 may be or include, for example, a die (the die 1502 of FIG. 13B), an IC device, or any other suitable component. In particular, the IC package 1720 may include one or more dies and/or microelectronic assemblies (e.g., dies and microelectronic assemblies as described with reference to FIGS. 1-11) and/or one or more IC packages (e.g., IC packages 1200) as described herein. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include any number of metal lines 1710, vias 1708, and TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
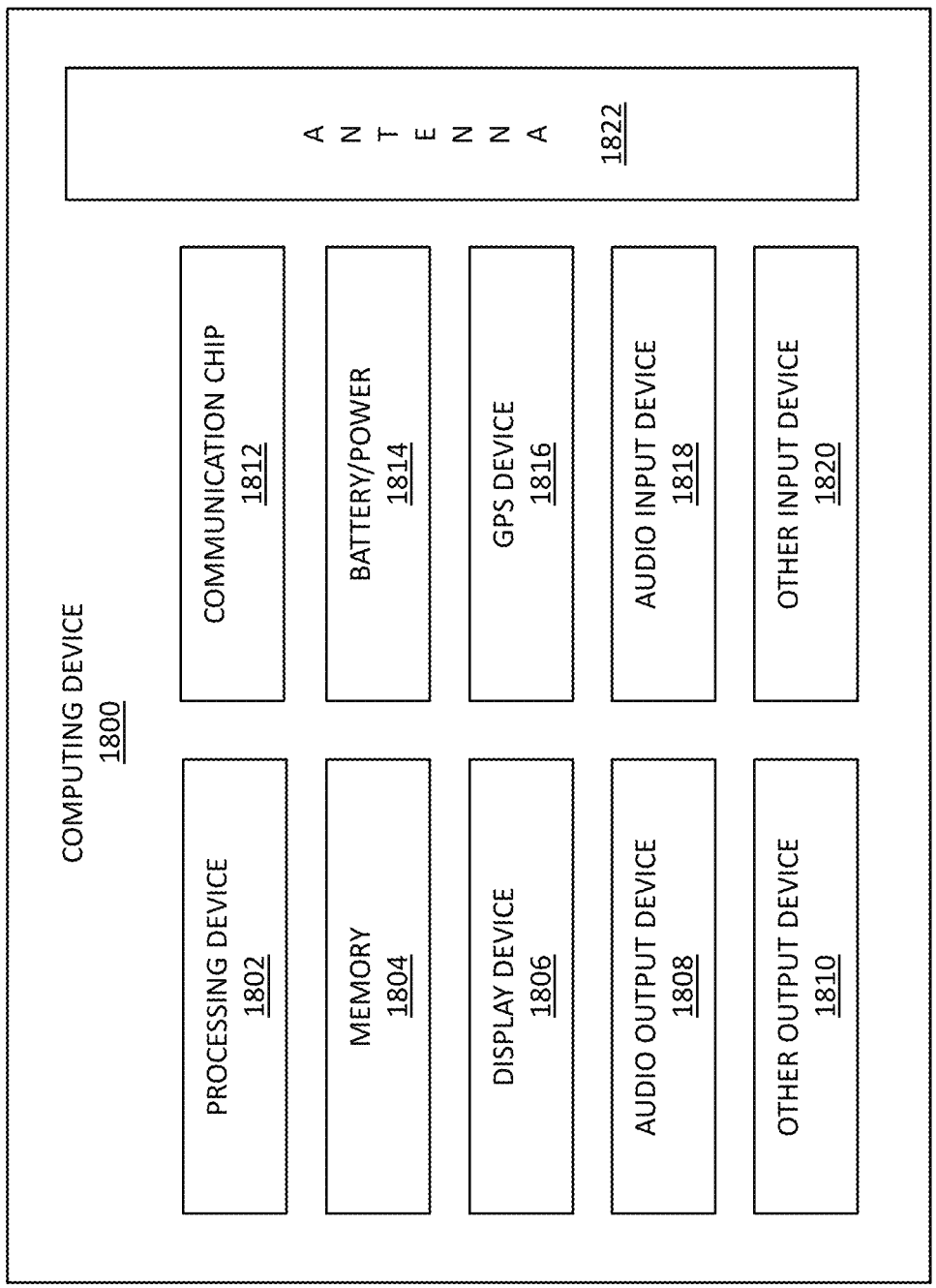
FIG. 16 is a block diagram of an example computing device 1800 that may include one or more dies and/or microelectronic assemblies as described herein, in accordance with some embodiments.

FIG. 16 is a block diagram of an example computing device 1800 that may include one or more components with one or more dies and/or microelectronic assemblies in accordance with any of the embodiments disclosed herein. For example, any suitable ones of the components of the computing device 1800 may include an IC package (e.g., the IC package 1720, shown in FIG. 15 and/or the IC package 1200 shown in FIG. 12) including one or more dies and/or microelectronic assemblies described with reference to FIGS. 1-11. Any of the components of the computing device 1800 may include an IC device 1400 (e.g., as shown in FIG. 14). Any of the components of the computing device 1800 may include an IC device assembly 1700 (e.g., as shown in FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single SoC die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1818 or an audio output device 1808 but may include audio input or output device interface circuitry (e.g., connectors and supporting circuitry) to which an audio input device 1818 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802.

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1818 (or corresponding interface circuitry, as discussed above). The audio input device 1818 may include any device that generates a signal representative of a sound, such as microphones, microphone arrays, or digital instruments (e.g., instruments having a musical instrument digital interface (MIDI) output).

The computing device 1800 may include a GPS device 1816 (or corresponding interface circuitry, as discussed above). The GPS device 1816 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides a microelectronic assembly that includes a base memory structure (e.g., a base structure 110) and a die stack (e.g., a stack 120), coupled to the base memory structure. The base memory structure includes a base memory die (e.g., a memory die 112), a base compute die (e.g., a compute die 114), and a bonding interface die (e.g., a compute die 114), and a bonding interface between the base memory die and the base compute die. The die stack includes a stack memory die (e.g., a memory die 122) and a stack compute die (e.g., stack compute die 120). The base memory die includes a plurality of memory cells that include backend transistors, and a base memory die control logic that includes frontend transistors. The base compute die includes a plurality of frontend transistors configured to control operation of the base memory die. The microelectronic assembly further includes signal vias and power vias extending through the bonding interface between the base memory die and the base compute die, where cross-sectional dimensions and a pitch of the power vias are larger than cross-sectional dimensions and a pitch of the signal vias. The die stack is coupled to the base memory structure by having the stack memory die being coupled to the base compute die.

Example A2 provides the microelectronic assembly according to example A1, where the plurality of memory cells include DRAM cells.

Example A3 provides the microelectronic assembly according to examples A1 or A2, where the stack memory die includes a plurality of SRAM cells.

Example A4 provides the microelectronic assembly according to any one of the preceding examples A, where the base memory structure is configured to implement a flat hierarchy memory.

Example A5 provides the microelectronic assembly according to any one of the preceding examples A, where the stack memory die is configured to implement a hierarchical memory.

Example A6 provides the microelectronic assembly according to any one of the preceding examples A, where the backend transistors of the plurality of memory cells of the base memory die are coupled in a plurality of pairs of backend transistors, where, for each pair of the plurality of pairs the pair includes a first backend transistor and a second backend transistor, the first and second backend transistors share a continuous layer of a channel material, a gate contact and a first S/D contact for each of the first and second backend transistors are provided over a first surface of the channel material, and a second S/D contact for each of the first and second backend transistors is a shared S/D contact, provided over a second surface of the channel material, the second surface being opposite the first surface.

Example A7 provides the microelectronic assembly according to example A6, where the gate contact for the first backend transistor and the gate contact for the second backend transistor are provided over a portion of the channel material that is between a portion of the channel material coupled to the first S/D contact of the first backend transistor and a portion of the channel material coupled to the first S/D contact of the second backend transistor.

Example A8 provides the microelectronic assembly according to any one of the preceding examples A, where the bonding interface between the base memory die and the base compute die is a hybrid bonding interface.

Example A9 provides the microelectronic assembly according to any one of the preceding examples A, where the pitch of the power vias extending through the bonding interface between the base memory die and the base compute die is between about 10 and 25 micron, e.g., between about 15 and 20 micron, and the pitch of the signal vias extending through the bonding interface between the base memory die and the base compute die is between about 2 and 12 micron, e.g., between about 4 and 9 micron.

Example A10 provides the microelectronic assembly according to any one of the preceding examples A, where the cross-sectional dimensions of the power vias extending through the bonding interface between the base memory die and the base compute die are between about 7 and 11 micron, e.g., about 9 micron, and the cross-sectional dimensions of the signal vias extending through the bonding interface between the base memory die and the base compute die are between about 2 and 4 micron, e.g., about 3 micron. In some embodiments, the cross-sectional dimensions of power/signal vias may be between about 35% and 65%, e.g., between about 45% and 55%, of the respective pitch of these vias.

Example A11 provides an IC package that includes a base structure having a backside and an opposing frontside. The IC package further includes a microelectronic assembly, coupled to the base structure by base interconnects. The microelectronic assembly includes a first die having a backside, an opposing frontside, a plurality of signal vias, and a plurality of IC devices, where the backside of the first die is coupled to the frontside of the base structure by the base interconnects. The microelectronic assembly further includes a second die having a backside, an opposing frontside, a plurality of signal vias, and a plurality of IC devices, where the microelectronic assembly includes a first bonding interface between the frontside of the first die bonded to the frontside of the second die, where the plurality of IC devices of at least one of the first die and the second die includes SRAM cells or DRAM cells, and where at least one of the plurality of signal vias of the first die extends to the frontside of the first die and is electrically coupled to at least one of the plurality of signal vias of the second die that extends to the frontside of the second die. The microelectronic assembly also includes a compute logic die having a backside, an opposing frontside, and a plurality of IC devices, where the microelectronic assembly includes a compute logic bonding interface between the frontside of the compute logic die bonded to the backside of the second die or to a side of a further die, the further die coupled to the second die. Still further, the microelectronic assembly includes a plurality of power vias extending between the frontside of the compute logic die and two or more of the base interconnects, the plurality of power vias configured to provide power to the plurality of IC devices of the first die, the second die, and the compute logic die.

Example A12 provides the IC package according to example A11, further including the further die having a backside, an opposing frontside, and a plurality of IC devices, where the side of the further die bonded to the frontside of the compute logic die is one of the backside and the frontside of the further die, the microelectronic assembly further includes a second bonding interface between the backside of the second die bonded to one of the backside and the front side of the further die that is not bonded to the frontside of the compute logic die, the plurality of power vias is further configured to provide power to the plurality of IC devices of the further die, and the plurality of power vias extends through the first bonding interface and the second bonding interface.

Example A13 provides the IC package according to example A12, where the further die further includes a plurality of signal vias, and at least one of the plurality of signal vias of the second die extends to the backside of the second die and is electrically coupled to at least one of the plurality of signal vias of the further die that extends to the one of the backside and the front side of the further die that is bonded to the backside of the second die.

Example A14 provides the IC package according to examples A12 or A13, where the plurality of IC devices of both the first die and the second die includes SRAM cells or DRAM cells, and the plurality of IC devices of the further die includes memory cells.

Example A15 provides the IC package according to examples A12 or A13, where the plurality of IC devices of only one of the first die and the second die includes SRAM cells, the plurality of IC devices of one of the first die and the second die that does not include SRAM cells includes compute logic devices, and the plurality of IC devices of the further die includes memory cells.

Example A16 provides the IC package according to any one of examples A12-A15, where the plurality of IC devices of the compute logic die includes devices configured to provide control, input/output, and other functions for at least one of the plurality of IC devices of the first die, the second die, and the further die.

Example A17 provides the IC package according to any one of examples A11-A17, further including a third die having a backside, an opposing frontside, and a plurality of IC devices, and still further including the further die having a backside, an opposing frontside, and a plurality of IC devices, where the microelectronic assembly further includes a second bonding interface between the backside of the second die bonded to the backside of the third die, the microelectronic assembly further includes a third bonding interface between the frontside of the third die bonded to the frontside of the further die, so that the further die is coupled to the second die by being bonded to the third die and the third die being bonded to the second die, the side of the further die bonded to the frontside of the compute logic die is the backside of the further die, the plurality of power vias is further configured to provide power to the plurality of IC devices of the third die and of the further die, and the plurality of power vias extends through the first bonding interface, the second bonding interface, and the fourth bonding interface.

Example A18 provides the IC package according to example A17, where the further die further includes a plurality of signal vias, at least one of the plurality of signal vias of the second die extends to the backside of the second die and is electrically coupled to at least one of the plurality of signal vias of the third die that extends to the backside of the third die that is bonded to the backside of the second die.

Example A19 provides the IC package according to examples A17 or A18, where the third die further includes a plurality of signal vias, the further die further includes a plurality of signal vias, and at least one of the plurality of signal vias of the third die extends to the frontside of the third die and is electrically coupled to at least one of the plurality of signal vias of the further die that extends to the frontside of the further die that is bonded to the frontside of the third die.

Example A20 provides the IC package according to any one of examples A11-A19, where a pitch of the plurality of power vias is at least two times larger than a pitch of the plurality of signal vias of at least one of the first die and the second die.

Example A21 provides the IC package according to any one of examples A11-A20, where a pitch of the plurality of power vias is between about 10 and 25 micron, e.g., between about 15 and 20 micron, and a pitch of the plurality of signal vias of at least one of the first die and the second die is between about 2 and 12 micron, e.g., between about 4 and 9 micron.

Example A22 provides the IC package according to any one of examples A11-A21, where a pitch of the base interconnects is between about 15 and 40 micron, e.g., between about 18 and 36 micron.

Example A23 provides the IC package according to any one of examples A11-A22, where dimensions of transverse cross-sections of the plurality of power vias are at least two and a half times larger than dimensions of transverse cross-sections of the plurality of signal vias of at least one of the first die and the second die.

Example A24 provides the IC package according to any one of examples A11-A23, where dimensions of transverse cross-sections of the plurality of power vias are between about 7 and 11 micron, e.g., about 9 micron, dimensions of transverse cross-sections of the plurality of signal vias of at least one of the first die and the second die is between about 2 and 4 micron, e.g., about 3 micron.

Example A25 provides the IC package according to any one of examples A11-A24, where the base interconnects include die-to-base interconnects, e.g., DTD interconnects or DTPS interconnects.

Example A26 provides the IC package according to any one of examples A11-A25, where the base interconnects include solder.

Example A27 provides the IC package according to any one of examples A11-A26, where the base interconnects include an anisotropic conductive material.

Example A28 provides the IC package according to any one of examples A11-A27, where, in a plane that is substantially perpendicular to the base structure, a cross-section of each of the plurality of signal vias of the first die and the plurality of signal vias of the second die is a trapezoid that includes two parallel sides, one of which is a short side and another one of which is a long side, for each trapezoid of the plurality of signal vias of the first die, the long side is closer to the first bonding interface than the short side, and for each trapezoid of the plurality of signal vias of the second die, the long side is closer to the first bonding interface than the short side.

Example A29 provides the IC package according to any one of examples A11-A28, where the first bonding interface includes an etch-stop material in at least portions where the frontside of the first die is bonded to the frontside of the second die, the etch-stop material including silicon, nitrogen, and carbon, where an atomic percentage of each of silicon, nitrogen, and carbon within the etch-stop material is at least about 1%, e.g., at least about 5%, e.g., between about 1% and 50%, indicating that these elements are added deliberately, as opposed to being accidental impurities which are typically in concentration below about 0.1%.

Example A30 provides the IC package according to any one of examples A11-A29, where the base structure is a package substrate and where the package substrate includes one or more of a ceramic material and an organic material.

Example A31 provides the IC package according to any one of examples A11-A29, where the base structure is a PCB.

Example A32 provides the IC package according to any one of examples A11-A29, where the base structure is a non-hierarchical memory.

Example B1 provides a microelectronic assembly that includes a compute die; and a memory die (e.g., a base memory die 112 or 412), coupled to the compute die. The memory die includes a data block (e.g., a data block 810) that includes a memory array circuit (e.g., a memory array circuit 820), where the memory array circuit includes a memory array (e.g., a memory array 822) and a plurality of signal vias (e.g., signal vias 824) associated with the memory array by being configured to communicate signals to or from the memory array, and a plurality of power vias (e.g., power vias 830) associated with the data block by being configured to provide power to components of the data block, where the plurality of power vias and the plurality of signal vias extend between opposing faces of the memory die (i.e., the power and signal vias are TSVs), the plurality of signal vias are arranged in a first line (e.g., a line associated with one of the groups 826), the plurality of signal vias are arranged in a second line (e.g., a line associated with one of the groups 836), and in a plane of the memory die, the second line is substantially perpendicular to the first line.

Example B2 provides the microelectronic assembly according to example B1, where a pitch of the plurality of power vias is larger than a pitch of the plurality of signal vias.

Example B3 provides the microelectronic assembly according to example B2, where the pitch of the plurality of power vias is between about 10 and 25 micron, e.g., between about 15 and 20 micron, and the pitch of the plurality of signal vias is between about 2 and 12 micron, e.g., between about 4 and 9 micron.

Example B4 provides the microelectronic assembly according to any one of the preceding examples B, where a cross-sectional dimension (e.g., a diameter) of any of the plurality of power vias is larger than a cross-sectional dimension (e.g., a diameter) of any of the plurality of signal vias.

Example B5 provides the microelectronic assembly according to example B4, where the cross-sectional dimension of any of the plurality of power vias is between about 7 and 11 micron, e.g., about 9 micron, and the cross-sectional dimension of any of the plurality of signal vias is between about 2 and 4 micron, e.g., about 3 micron.

Example B6 provides the microelectronic assembly according to any one of the preceding examples B, where the first line is substantially parallel to an edge of the memory array.

Example B7 provides the microelectronic assembly according to any one of the preceding examples B, where the second line is substantially parallel to an edge of the data block.

Example B8 provides the microelectronic assembly according to any one of the preceding examples B, where the memory array is one of a plurality of memory arrays included in the memory array circuit, and where each of the plurality of memory arrays is associated with a respective plurality of signal vias.

Example B9 provides the microelectronic assembly according to any one of the preceding examples B, where the memory array circuit is one of a plurality of memory array circuits included in the data block, and where each of the plurality of memory array circuits is associated with a respective plurality of power vias.

Example 1310 provides the microelectronic assembly according to any one of the preceding examples B, where the data block is one of a plurality of data blocks of the microelectronic assembly.

Example B11 provides the microelectronic assembly according to any one of the preceding example B, where the memory die includes a plurality of memory cells that include backend transistors.

Example B12 provides the microelectronic assembly according to example B11, where the backend transistors of the plurality of memory cells of the memory die are coupled in a plurality of pairs of backend transistors, where, for each pair of the plurality of pairs the pair includes a first backend transistor and a second backend transistor, the first and second backend transistors share a continuous layer of a channel material, a gate contact and a first S/D contact for each of the first and second backend transistors are provided over a first surface of the channel material, and a second S/D contact for each of the first and second backend transistors is a shared S/D contact, provided over a second surface of the channel material, the second surface being opposite the first surface.

Example B13 provides the microelectronic assembly according to example B12, where the gate contact for the first backend transistor and the gate contact for the second backend transistor are provided over a portion of the channel material that is between a portion of the channel material coupled to the first S/D contact of the first backend transistor and a portion of the channel material coupled to the first S/D contact of the second backend transistor.

Example C1 provides a microelectronic assembly that includes a stitched memory die (e.g., a base memory die 112 or 412), including a first memory die (e.g., a memory die 910-1) and a second memory die (e.g., a memory die 910-2). The first memory die includes first components (e.g., a plurality of first memory cells, e.g., such as the memory cells 600) and first conductive lines (e.g., die metal lines 920 of the memory die 910-1), the first conductive lines configured to provide electrical connectivity between various two or more of the first components. The second memory die includes second components (e.g., a plurality of second memory cells, e.g., such as the memory cells 600) and second conductive lines (e.g., die metal lines 920 of the memory die 910-2), the second conductive lines configured to provide electrical connectivity between various two or more of the second components, the second memory die being coplanar with the first memory die. The stitched memory die further includes a stitch conductive line (e.g., a stitch metal line 940), provided in a plane of or parallel to a plane of the first memory die (or a plane of the second memory die, since these two dies are coplanar), having a first end electrically coupled to at least one of the first conductive lines and having a second end electrically coupled to at least one of the second conductive lines.

Example C2 provides the microelectronic assembly according to example C1, where the stitch conductive line is substantially perpendicular to at least a subset of the first conductive lines.

Example C3 provides the microelectronic assembly according to examples C1 or C2, where the stitch conductive line is substantially perpendicular to at least a subset of the second conductive lines.

Example C4 provides the microelectronic assembly according to any one of the preceding examples C, where the first conductive lines or the second conductive lines include copper (Cu), and the stitch conductive line includes tungsten (W), aluminum (Al), ruthenium (Ru), cobalt (Co), or an alloy of Cu and Al.

Example C5 provides the microelectronic assembly according to any one of the preceding examples C, where a material composition of the stitch conductive line is at least about 5% different from a material composition of the first conductive lines or a material composition of the second conductive lines.

Example C6 provides the microelectronic assembly according to any one of the preceding examples C, where a height of the stitch conductive line is at least about 5% different from a height of the first conductive lines or a height of the second conductive lines.

Example C7 provides the microelectronic assembly according to any one of the preceding examples C, where an area of a transverse cross-section of the stitch conductive line is at least about 5% different from an area of a transverse cross-section of the first conductive lines or an area of a transverse cross-section of the second conductive lines.

Example C8 provides the microelectronic assembly according to any one of the preceding examples C, where the first conductive lines and the second conductive lines include a liner material, and the stitch conductive line does not include a liner material.

Example C9 provides the microelectronic assembly according to any one of the preceding examples C, where the first end of the stitch conductive line is misaligned with respect to a sidewall of the at least one of the first conductive lines, or the second end of the stitch conductive line is misaligned with respect to a sidewall of the at least one of the second conductive lines.

Example C10 provides the microelectronic assembly according to example C9, where the first end of the stitch conductive line is misaligned with respect to the sidewall of the at least one of the first conductive lines by between about 0.2 and 5 nanometers, including all values and ranges therein, e.g., between about 0.2 and 3 nanometers, or between about 0.5 and 3 nanometers, or the second end of the stitch conductive line is misaligned with respect to the sidewall of the at least one of the second conductive lines by between about 0.2 and 5 nanometers, including all values and ranges therein, e.g., between about 0.2 and 3 nanometers, or between about 0.5 and 3 nanometers.

Example C11 provides the microelectronic assembly according to any one of the preceding example C, where at least one of the first memory die and the second memory die includes a plurality of memory cells that include backend transistors.

Example C12 provides the microelectronic assembly according to example C11, where the backend transistors are coupled in a plurality of pairs of backend transistors, where, for each pair of the plurality of pairs the pair includes a first backend transistor and a second backend transistor, the first and second backend transistors share a continuous layer of a channel material, a gate contact and a first S/D contact for each of the first and second backend transistors are provided over a first surface of the channel material, and a second S/D contact for each of the first and second backend transistors is a shared S/D contact, provided over a second surface of the channel material, the second surface being opposite the first surface.

Example C13 provides the microelectronic assembly according to example C12, where the gate contact for the first backend transistor and the gate contact for the second backend transistor are provided over a portion of the channel material that is between a portion of the channel material coupled to the first S/D contact of the first backend transistor and a portion of the channel material coupled to the first S/D contact of the second backend transistor.

Example D1 provides a microelectronic assembly that includes a glass carrier structure (e.g., a glass carrier 1108); a die (e.g., a die 1102), including an IC structure, where each of the glass carrier structure and the die has a frontside and a backside, the backside being a face that is opposite the frontside; and a bonding material between the frontside of the die and the frontside of the glass carrier to secure (attach) the frontside of the die to the frontside of the glass carrier.

Example D2 provides the microelectronic assembly according to example D1, where the glass carrier structure is a quartz substrate.

Example D3 provides the microelectronic assembly according to examples D1 or D2, where a thickness of the die is between about 5 and 14 micron.

Example D4 provides the microelectronic assembly according to any one of the preceding examples D, where a thickness of a die is smaller than a thickness of the glass carrier.

Example D5 provides the microelectronic assembly according to any one of the preceding examples D, further including a plurality of electrically conductive structures (e.g., any combination of the vias 1104, the interconnects 1106, and the interconnects 1134, in any geometry and relative arrangement) between the backside of the die and the backside of the glass carrier structure.

Example D6 provides the microelectronic assembly according to any one of the preceding examples D, further including a plurality of vias (e.g., vias 1104) extending between the backside and the frontside of the die.

Example D7 provides the microelectronic assembly according to example D6, where the die is a first die, the IC structure is a first IC structures and the microelectronic assembly further includes a second die, the second die including a second IC structure and being coupled to the plurality of vias at the backside of the first die.

Example D8 provides the microelectronic assembly according to example D7, further including a redistribution layer (e.g., a RDL 1114) and a plurality of DTD interconnects (e.g., interconnects 1132), where the second die is coupled to the plurality of vias at the backside of the first die by having a plurality of interconnects of the redistribution layer being coupled to the plurality of vias at the backside of the first die and to the DTD interconnects, and the DTD interconnects being coupled to the plurality of interconnects of the redistribution layer.

Example D9 provides the microelectronic assembly according to examples D7 or D8, where the second die is one of a plurality of second dies, each coupled to the first die.

Example D10 provides the microelectronic assembly according to any one of the preceding examples D, where the bonding material includes silicon, nitrogen, and carbon, e.g., SiOCN, where the atomic percentage of any of these materials may be at least 1%, e.g., between about 1% and 50%, indicating that these elements are added deliberately, as opposed to being accidental impurities.

Example D11 provides the microelectronic assembly according to any one of the preceding example D, where the die is a memory die that includes a plurality of memory cells that include backend transistors.

Example D12 provides the microelectronic assembly according to example D11, where the backend transistors are coupled in a plurality of pairs of backend transistors, where, for each pair of the plurality of pairs the pair includes a first backend transistor and a second backend transistor, the first and second backend transistors share a continuous layer of a channel material, a gate contact and a first S/D contact for each of the first and second backend transistors are provided over a first surface of the channel material, and a second S/D contact for each of the first and second backend transistors is a shared S/D contact, provided over a second surface of the channel material, the second surface being opposite the first surface.

Example D13 provides the microelectronic assembly according to example D12, where the gate contact for the first backend transistor and the gate contact for the second backend transistor are provided over a portion of the channel material that is between a portion of the channel material coupled to the first S/D contact of the first backend transistor and a portion of the channel material coupled to the first S/D contact of the second backend transistor.

Example E1 provides an IC package that includes a microelectronic assembly according to any one of the preceding examples A, B, C, or D, and a further IC component, coupled to the microelectronic assembly.

Example E2 provides the IC package according to example E1, where the further component is a package substrate and where the package substrate includes one or more of a ceramic material and an organic material.

Example E3 provides the IC package according to example E1, where the further component is a PCB.

Example E4 provides the IC package according to example E1, where the further component is a flexible substrate or an interposer.

Example E5 provides the IC package according to any one of examples E1-E4, where the further component is coupled to the microelectronic assembly via one or more first-level interconnects.

Example E6 provides the IC package according to example E5, where the one or more first-level interconnects include one or more solder bumps, solder posts, or bond wires.

Example E7 provides the IC package according to any one of examples E1-E6, further including a mold material, at least partially enclosing the microelectronic assembly.

Example E8 provides the IC package according to any one of examples E1-E7, further including a heat spreader, configured to dissipate heat from the microelectronic assembly.

Example E9 provides an electronic device that includes a circuit board; and a microelectronic assembly coupled to the circuit board, where the microelectronic assembly is a microelectronic assembly according to any one of the preceding examples A, B, C, or D, and/or is included in an IC package according to any one of the preceding examples E.

Example E10 provides the electronic device according to example E9, where the electronic device is a wearable electronic device (e.g., a smart watch) or handheld electronic device (e.g., a mobile phone).

Example E11 provides the electronic device according to examples E9 or E10, where the electronic device is a server processor.

Example E12 provides the electronic device according to any one of examples E9-E11, where the electronic device is a motherboard.

Example E13 provides the electronic device according to any one of examples E9-E12, where the electronic device is a computing device.

Example E14 provides the electronic device according to any one of examples E9-E13, where the electronic device is a processor.

Example E15 provides the electronic device according to any one of examples E9-E14, where the electronic device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A microelectronic assembly, comprising:
a structure including a first die, a second die, and a bonding interface between the first die and the second die; and
a third die coupled to the second die;
wherein:
the first die includes memory cells comprising backend transistors and further includes logic circuitry comprising frontend transistors,
the second die includes frontend transistors coupled to the first die, and
the microelectronic assembly further includes first vias and second vias extending through the bonding interface between the first die and the second die, wherein cross-sectional dimensions of the second vias are larger than cross-sectional dimensions of the first vias, and a pitch of the second vias is larger than a pitch of the first vias.

2. The microelectronic assembly according to claim 1, wherein the memory cells include dynamic random-access memory cells.

3. The microelectronic assembly according to claim 2, wherein the third die includes static random-access memory cells.

4. The microelectronic assembly according to claim 1, wherein the memory cells include a non-hierarchical memory.

5. The microelectronic assembly according to claim 1, wherein the third die includes a hierarchical memory.

6. The microelectronic assembly according to claim 1, wherein the backend transistors of the memory cells of the first die are coupled in pairs of backend transistors, and wherein, for an individual pair of the pairs:
the individual pair includes a first backend transistor and a second backend transistor,
the first and second backend transistors share a continuous layer of a semiconductor material,
a gate contact and a first contact for an individual one of the first and second backend transistors are over a first surface of the semiconductor material, and
a second contact for each of the first and second backend transistors is a shared contact over a second surface of the semiconductor material, the second surface being opposite the first surface, wherein one of the first contact and the second contact is a source contact and another one of the first contact and the second contact is a drain contact.

7. The microelectronic assembly according to claim 6, wherein the gate contact for the first backend transistor and the gate contact for the second backend transistor are over a portion of the semiconductor material that is between a portion of the semiconductor material in conductive contact with the first contact of the first backend transistor and a portion of the semiconductor material in conductive contact with the first contact of the second backend transistor.

8. The microelectronic assembly according to claim 1, wherein the bonding interface between the first die and the second die is a hybrid bonding interface.

9. The microelectronic assembly according to claim 1, wherein the pitch of the second vias is between about 10 and 25 micrometers.

10. The microelectronic assembly according to claim 1, wherein the cross-sectional dimensions of the second vias are between about 7 and 11 micrometers, and the cross-sectional dimensions of the first vias are between about 2 and 4 micrometers.

11. The microelectronic assembly according to claim 1, further comprising a glass structure and a bonding material, wherein the bonding material is between a surface of the first die and a surface of the glass structure.

12. The microelectronic assembly according to claim 11, wherein the glass structure includes quartz.

13. The microelectronic assembly according to claim 11, wherein a thickness of the first die is smaller than a thickness of the glass structure.

14. The microelectronic assembly according to claim 11, wherein the bonding material includes silicon, nitrogen, and carbon.

15. The microelectronic assembly according to claim 1, wherein the first vias are signal vias and the second vias are power vias.

16. The microelectronic assembly according to claim 1, wherein the frontend transistors of the second die are to at least partially control operation of the first die.

17. The microelectronic assembly according to claim 1, wherein the pitch of the first vias is between about 2 and 12 micrometers.

18. A microelectronic assembly, comprising:
a compute die; and
a memory die, coupled to the compute die, the memory die comprising:
a data block that includes a memory array circuit, where the memory array circuit includes a memory array and a plurality of first vias to communicate signals with the memory array, and
a plurality of second vias to provide power to components of the data block, wherein:
the plurality of second vias and the plurality of first vias extend between opposing faces of the memory die,
the plurality of first vias are arranged along a first line,
the plurality of second vias are arranged along a second line, and
the second line is substantially perpendicular to the first line.

19. The microelectronic assembly according to claim 18, wherein the first line is substantially parallel to an edge of the memory array.

20. The microelectronic assembly according to claim 19, wherein the second line is substantially parallel to an edge of the data block.

21. The microelectronic assembly according to claim 18, wherein:
the memory array is one of a plurality of memory arrays included in the memory array circuit, and each of the plurality of memory arrays is associated with a respective plurality of first vias, and
the memory array circuit is one of a plurality of memory array circuits included in the data block, and each of the plurality of memory array circuits is associated with a respective plurality of second vias.

22. An integrated circuit (IC) package, comprising:
a microelectronic assembly; and
a further IC component, the further IC component coupled to the microelectronic assembly,
wherein the microelectronic assembly includes:
a structure including a first die, a second die, and a bonding interface between the first die and the second die, and a third die coupled to the second die;

wherein:

the first die includes memory cells comprising backend transistors and further includes logic circuitry comprising frontend transistors, the second die includes frontend transistors coupled to the first die, and the microelectronic assembly further includes first vias and second vias extending through the bonding interface between the first die and the second die, wherein cross-sectional dimensions of the second vias are larger than cross-sectional dimensions of the first vias, and a pitch of the second vias is larger than a pitch of the first vias.

23. The IC package according to claim 22, wherein the further component is a package substrate and where the package substrate includes one or more of a ceramic material and an organic material.

24. The IC package according to claim 22, wherein the further component is a printed circuit board, a flexible substrate, or an interposer.

25. The IC package according to claim 22, further comprising interconnects between the further component and the microelectronic assembly, wherein the interconnects include one or more solder bumps, solder posts, or bond wires.

26. The IC package according to claim 22, further comprising a heat spreader.

* * * * *